United States Patent
Ikebe et al.

(10) Patent No.: US 11,237,472 B2
(45) Date of Patent: Feb. 1, 2022

(54) REFLECTIVE MASK BLANK, REFLECTIVE MASK AND MANUFACTURING METHOD THEREOF, AND SEMICONDUCTOR DEVICE MANUFACTURING METHOD

(71) Applicant: HOYA CORPORATION, Tokyo (JP)

(72) Inventors: Yohei Ikebe, Tokyo (JP); Junichi Horikawa, Tokyo (JP); Takahiro Onoue, Tokyo (JP); Mizuki Kataoka, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 225 days.

(21) Appl. No.: 16/490,010

(22) PCT Filed: Mar. 1, 2018

(86) PCT No.: PCT/JP2018/007897
§ 371 (c)(1),
(2) Date: Aug. 29, 2019

(87) PCT Pub. No.: WO2018/159785
PCT Pub. Date: Sep. 7, 2018

(65) Prior Publication Data
US 2019/0384157 A1    Dec. 19, 2019

(30) Foreign Application Priority Data

Mar. 2, 2017   (JP) .............................. JP2017-039100

(51) Int. Cl.
*G03F 1/24*   (2012.01)
*G03F 1/54*   (2012.01)
*G03F 7/20*   (2006.01)

(52) U.S. Cl.
CPC .................. *G03F 1/24* (2013.01); *G03F 1/54* (2013.01); *G03F 7/2004* (2013.01)

(58) Field of Classification Search
CPC ............. G03F 1/24; G03F 1/54; G03F 7/2004
USPC ......................................................... 430/5
See application file for complete search history.

(56) References Cited

U.S. PATENT DOCUMENTS

| | | | |
|---|---|---|---|
| 5,641,593 A | 6/1997 | Watanabe et al. | |
| 2002/0115000 A1 | 8/2002 | Gupta et al. | |
| 2005/0208389 A1 | 9/2005 | Ishibashi et al. | |
| 2005/0238963 A1 | 10/2005 | Ishibashi et al. | |
| 2006/0251973 A1 | 11/2006 | Takaki et al. | |
| 2009/0130569 A1 | 5/2009 | Quesnel | |
| 2010/0167181 A1 | 7/2010 | Kim | |
| 2011/0217633 A1 | 9/2011 | Hosoya | |
| 2013/0100428 A1 | 4/2013 | Ruoff et al. | |
| 2015/0212402 A1 | 7/2015 | Patil et al. | |
| 2016/0223896 A1 | 8/2016 | Sun et al. | |
| 2016/0238925 A1 | 8/2016 | Hamamoto et al. | |
| 2019/0369483 A1* | 12/2019 | Ikebe | G03F 1/22 |

FOREIGN PATENT DOCUMENTS

| | | |
|---|---|---|
| JP | 07-114173 A | 5/1995 |
| JP | H08017716 A | 1/1996 |
| JP | 2002261005 A | 9/2002 |
| JP | 2004-006798 A | 1/2004 |
| JP | 2004-039884 A | 2/2004 |
| JP | 2004-207593 A | 7/2004 |
| JP | 2008-539573 A | 11/2008 |
| JP | 2010-080659 A | 4/2010 |
| JP | 2013-532381 A | 8/2013 |
| JP | 2015-073013 A | 4/2015 |
| TW | 404984 B | 9/2000 |
| TW | 200622508 A | 7/2006 |
| WO | 2006/030627 A1 | 3/2006 |
| WO | 2010/074125 A1 | 7/2010 |
| WO | 2015041023 A1 | 3/2015 |

OTHER PUBLICATIONS

SG11201907622Y, "Invitation to Respond to Written Opinion", dated Jun. 2, 2020, 7 pages.
PCT/JP2018/007897, English translation of International Search Report dated May 15, 2018.
TW107107032, "Office Action", dated Aug. 4, 2021, 6 pages.
JP2019-503127, "Notice of Reasons for Refusal" with Machine Translation, dated Sep. 21, 2021, 5 pages.

* cited by examiner

*Primary Examiner* — Christopher G Young
(74) *Attorney, Agent, or Firm* — Kilpatrick Townsend & Stockton LLP

(57) ABSTRACT

Provided are a reflective mask blank and a reflective mask, which are able to reduce the shadowing effects of EUV lithography and form a fine pattern. As a result, a semiconductor device can be stably manufactured with high transfer accuracy. The reflective mask blank comprises a multilayer reflective film and an absorber film in that order on a substrate, and the absorber film comprises a material comprising an amorphous metal comprising at least one or more elements among cobalt (Co) and nickel (Ni).

20 Claims, 13 Drawing Sheets

REFLECTIVE MASK BLANK, REFLECTIVE MASK AND MANUFACTURING METHOD THEREOF, AND SEMICONDUCTOR DEVICE MANUFACTURING METHOD

CROSS REFERENCE TO RELATED APPLICATIONS

This application is the U.S. National Phase application of International Application No. PCT/JP2018/007897, filed Mar. 1, 2018, which claims priority to Japanese Application No. 2017-039100, filed Mar. 2, 2017, and the contents of which is hereby incorporated by reference herein in its entirety.

TECHNICAL FIELD

The present disclosure relates to a production master for manufacturing an exposure mask used in the manufacturing of semiconductor devices and the like in the form of a reflective mask blank, a reflective mask, a production method thereof and a method of manufacturing a semiconductor device.

BACKGROUND ART

The types of light sources of exposure apparatuses used in the production of semiconductor devices are evolving while gradually using shorter wavelengths, as is indicated by the g-line having a wavelength of 436 nm, i-line having a wavelength of 365 nm, KrF lasers having a wavelength of 248 nm and ArF lasers having a wavelength of 193 nm, and EUV lithography using extreme ultraviolet (EUV) light, in which the wavelength is in the vicinity of 13.5 nm, has been developed in order to realize transfer of even finer patterns. In EUV lithography, a reflective mask is used due to the small number of materials that are transparent to EUV light. In this reflective mask, the basic structure consists of mask structure in which a multilayer reflective film that reflects exposure light is formed on a low thermal expansion substrate and a desired transfer pattern is formed on a protective film for protecting the multilayer reflective film. In addition, based on the configuration of the transfer pattern, typical examples of reflective masks consist of binary reflective masks having a comparatively thick absorber pattern that adequately absorbs EUV light, and phase shift reflective masks (halftone phase shift reflective masks) composed of a comparatively thin absorber pattern that generates reflected light in which the phase is nearly completely inverted (phase inversion of about 180°) relative to light reflected from the multilayer reflective film. Phase shift reflective masks (halftone phase shift reflective masks) allow the obtaining of high transferred optical image contrast due to phase shift effects in the same manner as transmissive optical phase shift masks, thereby making it possible to improve resolution. In addition, a highly accurate, fine phase shift pattern can be formed due to the thin film thickness of the absorber pattern (phase shift pattern) of the phase shift reflective mask.

Projection optical systems composed of a large number of reflecting mirrors are used in EUV lithography based on the relationship with light transmittance. EUV light enters a reflective mask on an angle and to prevent these multiple reflecting mirrors from blocking the projected light (exposure light). It is currently common to use an angle of 6° for the incident angle relative to the perpendicular plane of the reflective mask substrate. Studies are proceeding in the direction of using a more oblique angle of about 8° with improving the numerical aperture (NA) of projection optical system.

EUV lithography has a unique problem referred to as shadowing effect as a result of exposure light entering on an angle. The shadowing effect refers to a phenomenon in which the dimensions or location of a pattern formed by transfer change due to the formation of shadows caused by the entry of exposure light into an absorber pattern having a three-dimensional structure on an angle. The three-dimensional structure of the absorber pattern serves as a wall that allows the formation of a shadow on the shady side, thereby causing the dimensions or location of the pattern formed by transfer to change. For example, differences occur in the dimensions and location of two transfer patterns resulting in a decrease in transfer accuracy between the case of the orientation of the arranged absorber pattern being parallel to the direction of oblique incident light and the case of the orientation of the arranged absorber pattern being perpendicular.

Technologies relating to such reflective masks for EUV lithography and mask blanks used for the fabrication thereof are disclosed in Patent Documents 1 to 3. In addition, Patent Document 1 contains a disclosure regarding the shadowing effect. In the past, decreases in transfer accuracy caused by the shadowing effect have been attempted to be suppressed by making the film thickness of a phase shift pattern comparatively thinner than the case of a binary reflective mask by using a phase shift reflective mask as a reflective mask for EUV lithography.

PRIOR ART DOCUMENTS

Patent Documents

Patent Document 1: JP 2010-080659 A
Patent Document 2: JP 2004-207593 A
Patent Document 3: JP 2004-39884 A

DISCLOSURE OF THE INVENTION

Problems to be Solved by the Disclosure

The electrical properties and performance of semiconductor devices improve the finer the pattern and the greater the accuracy of the pattern dimensions and location, and the degree of integration can be improved and chip size can be reduced. Consequently, EUV lithography requires an even higher level of high-precision, fine-dimension pattern transfer performance than in the prior art. At present, half-pitch 16 nm (hp16 nm) next generation-compatible ultrafine, high-precision pattern formation is required. In order to satisfy this requirement, even greater reductions in thickness are required in order to reduce shadowing effects. In the case of EUV exposure in particular, it is necessary to reduce film thickness of the absorber film (phase shift film) to less than 60 nm and preferably to not more than 50 nm.

As is disclosed in Patent Documents 1 to 3, Ta has conventionally been used as a material that forms the absorber film (phase shift film) of reflective mask blanks. However, the refractive index of Ta in EUV light (having a wavelength of 13.5 nm, for example) is about 0.943, and even if phase shift effects are utilized, the limit on the reduction in thickness of an absorber film (phase shift film) formed with Ta alone is 60 nm. In order to reduce thickness even further, a metal material having a large extinction coefficient k (high absorption effect) can be used for the absorber film of a binary reflective mask blank, for example. Examples of metals having a large extinction coefficient at a wavelength of 13.5 nm include cobalt (Co) and nickel (Ni). However, since Co and Ni are magnetic, when electron beam drawing is carried out on a resist film on the absorber film deposited using these materials, there is the risk of the possibility of the pattern being unable to be drawn as designed.

With the foregoing in view, an aspect of the present disclosure is to provide a reflective mask blank capable of reducing the shadowing effect of reflective masks while also enabling the formation of a fine and highly accurate phase shift pattern, a reflective mask produced thereby, and a method of manufacturing a semiconductor device.

Means for Solving the Problems

The present disclosure has the following configurations in order to solve the aforementioned problems.

(Configuration 1)

A reflective mask blank having a multilayer reflective film and an absorber film in that order on a substrate, wherein, the absorber film is made of a material containing an amorphous metal containing at least one or more elements among cobalt (Co) and nickel (Ni).

(Configuration 2)

The reflective mask blank described in Configuration 1, wherein the amorphous metal has at least one or more elements among tungsten (W), niobium (Nb), tantalum (Ta), titanium (Ti), zirconium (Zr), hafnium (Hf), yttrium (Y) and phosphorous (P) added to at least one or more elements among the cobalt (Co) and nickel (Ni).

(Configuration 3)

The reflective mask blank described in Configuration 1 or 2, wherein the amorphous metal has tantalum (Ta) added to at least one or more elements among the cobalt (Co) and nickel (Ni), and the content of the tantalum (Ta) is 10 at % to 90 at %.

(Configuration 4)

The reflective mask blank described in any one of Configurations 1 to 3, wherein the reflective mask blank has a protective film between the multilayer reflective film and the absorber film.

(Configuration 5)

The reflective mask blank described in any one of Configurations 1 to 4, wherein the reflective mask blank has an etching mask film on the absorber film, and the etching mask film is made of a material containing chromium (Cr) or a material containing silicon (Si).

(Configuration 6)

The reflective mask blank described in Configuration 4 or 5, wherein the reflective mask blank has an etching stopper film between the protective film and the absorber film, and the etching stopper film is made of a material containing chromium (Cr) or a material containing silicon (Si).

(Configuration 7)

A reflective mask having an absorber pattern obtained by patterning the absorber film in the reflective mask blank described in any one of Configurations 1 to 6.

(Configuration 8)

A method of manufacturing a reflective mask in which an absorber pattern is formed by patterning the absorber film of the reflective mask blank described in any one of Configurations 1 to 6 by dry etching using a chlorine-based gas.

(Configuration 9)

A method of manufacturing a reflective mask in which an absorber pattern is formed by patterning the absorber film of the reflective mask blank described in any one of Configurations 1 to 6 by dry etching using a first chlorine-based gas and a second chlorine-based gas differing from the first chlorine-based gas.

(Configuration 10)

A method of manufacturing a semiconductor device having a step for placing the reflective mask described in Configuration 7 in an exposure apparatus having an exposure light source that emits EUV light and transferring a transfer pattern to a resist film formed on a transferred substrate.

Effects of the Disclosure

According to the reflective mask blank of the present disclosure (and the reflective mask blank produced thereby), the film thickness of an absorber film can be reduced, shadowing effects can be reduced, and a fine and highly accurate absorber pattern can be formed having a stable cross-sectional shape with little sidewall roughness. Thus, a reflective mask produced using a reflective mask blank employing this structure enables the fine and highly accurate formation of a phase shift pattern per se formed on the mask, while also being able to prevent reductions in accuracy during transfer attributable to shadowing. In addition, a method of manufacturing a fine and highly accurate semiconductor device can be provided by carrying out EUV lithography using this reflective mask.

MODE FOR CARRYING OUT THE INVENTION

Figure 1:
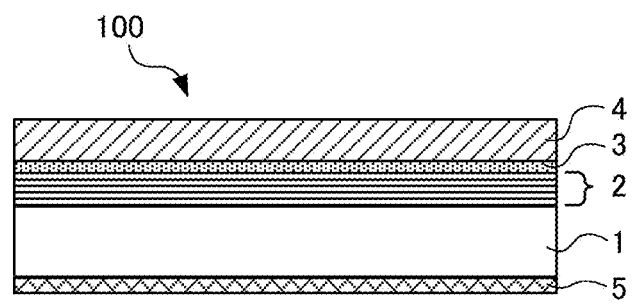
FIG. 1 is a cross-sectional schematic diagram of the main portions for explaining the general configuration of a reflective mask blank according to the present disclosure.

The following provides a detailed explanation of embodiments of the present disclosure with reference to the drawings. Furthermore, the following embodiments are merely aspects used when embodying the present disclosure and are not intended to limit the present disclosure to the scope thereof. Furthermore, in the drawings, the same reference symbols are used to indicate the same or equivalent portions and explanations thereof may be simplified and/or omitted.

Configuration of Reflective Mask Blank and Method of Manufacturing Same

FIG. 1 is a cross-sectional schematic diagram of the main portions for explaining the configuration of the reflective mask blank according to the present disclosure. As is indicated in the drawing, a reflective mask blank 100 has a mask blank substrate 1, a multilayer reflective film 2 formed on a first main surface (front side) that reflects exposure light in the form of EUV light, a protective film 3 provided to protect the multilayer reflective film 2 that is formed with a material having resistance to etchant and cleaning solution used when patterning an absorber film 4 to be subsequently described, and an absorber film 4 that absorbs EUV light, wherein these films are laminated in this order. In addition, a back side conductive film 5 for electrostatic chucking is formed on a second main surface (back side) of the substrate 1.

Figure 13:
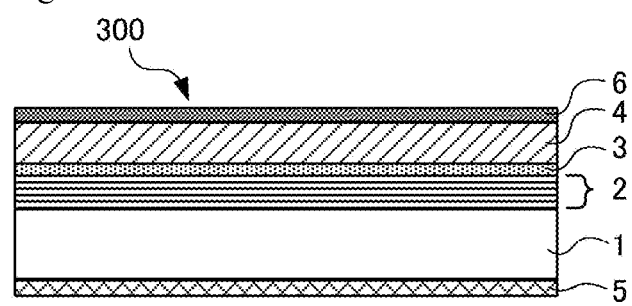
FIG. 13 is a cross-sectional schematic diagram of the main portions indicating another example of a reflective mask blank according to the present disclosure.
Figure 14A:
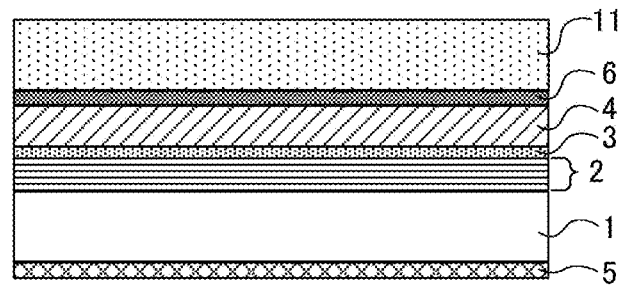
FIG. 14 is a process drawing indicating a process for manufacturing a reflective mask from the reflective mask blank shown in FIG. 13 with a cross-sectional schematic diagram of the main portions thereof.
Figure 14B:
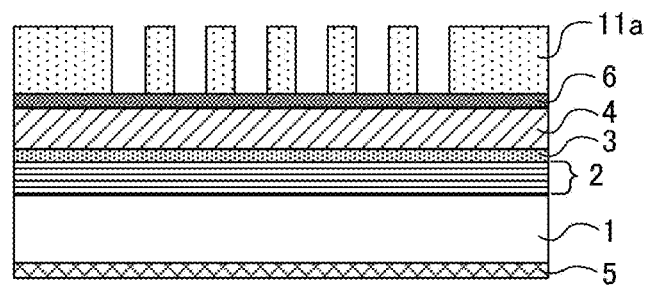
Figure 14C:
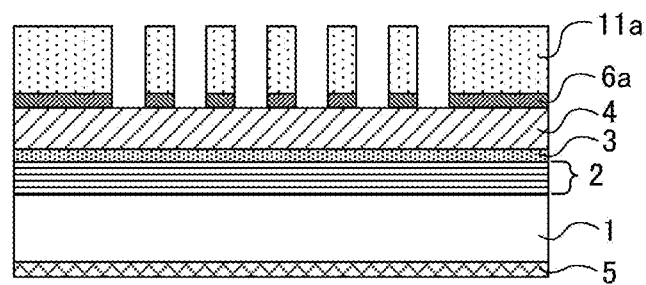
Figure 14D:
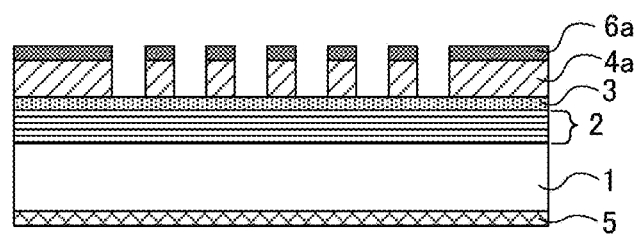
Figure 14E:
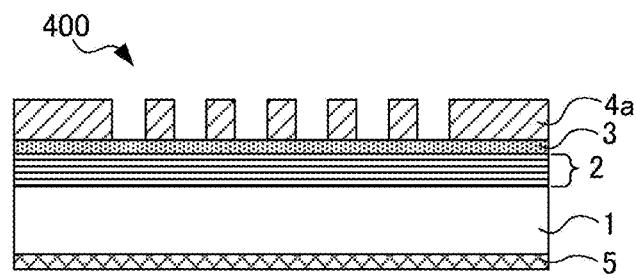

FIG. 13 is a cross-sectional schematic diagram of the main portions indicating another example of the reflective mask blank according to the present disclosure. A reflective mask blank 300 is provided with the substrate 1, the multilayer reflective film 2, the protective film 3, the absorber film 4 and the back side conductive film 5 in the same manner as the reflective mask blank 100 shown in FIG. 1. The reflective mask blank 300 shown in FIG. 13 further has an etching mask film 6 on the absorber film 4 that serves as an etching mask of the absorber film 4 during etching of the absorber film 4. Furthermore, in the case of using the reflective mask blank 300 having the etching mask film 6, the etching mask film 6 may be stripped after having formed a transfer pattern on the absorber film 4 as will be subsequently described.

Figure 15:
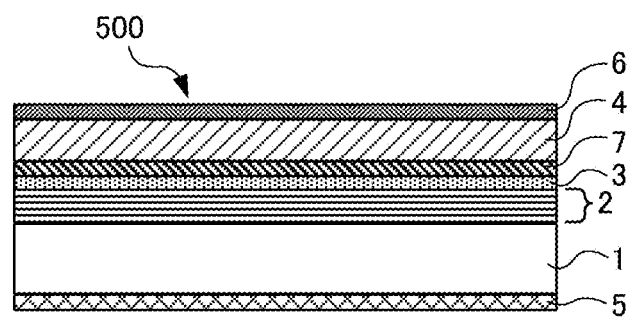
FIG. 15 is a cross-sectional schematic diagram of the main portions indicating still another example of a reflective mask blank according to the present disclosure.

FIG. 15 is a cross-sectional schematic diagram of the main portions indicating still another example of the reflective mask blank according to the present disclosure. A reflective mask blank 500 is provided with the substrate 1, the multilayer reflective film 2, the protective film 3, the absorber film 4, the etching mask film 6 and the back side conductive film 5 in the same manner as the reflective mask blank 300 shown in FIG. 13. The reflective mask blank 500 shown in FIG. 15 further has an etching stopper film 7 between the protective film 3 and the absorber film 4 that serves as an etching stopper during etching of the absorber film 4. Furthermore, in the case of using the reflective mask blank 500 having the etching mask film 6 and the etching stopper film 7, the etching mask film 6 and the etching stopper film 7 may be stripped after having formed a transfer pattern on the absorber film 4 as will be subsequently described.

In addition, the aforementioned reflective mask blanks 100, 300 and 500 include configurations in which the back side conductive film 5 is not formed. Moreover, the aforementioned reflective mask blanks 100, 300 and 500 include configurations of a mask blank with resist film in which a resist film is formed on the absorber film 4 or the etching mask film 6.

In the present description, "having a multilayer reflective film 2 on a main surface of the substrate 1" includes not only the case of the multilayer reflective film 2 being disposed in contact with the surface of the substrate 1, but also the case of having another film between the substrate 1 and the multilayer reflective film 2. This applies similarly to other films as well. In addition, in the present description, for example, "having a film A disposed in contact with a film B" refers to the film A and the film B being disposed so as to make direct contact without interposing another film between the film A and the film B.

The following provides detailed explanations of each of the configurations of the reflective mask blanks 100, 300 and 500.

Substrate

A substrate having a low thermal expansion coefficient within a range of 0 ppb/° C.±5 ppb/° C. is used preferably for the substrate 1 in order to prevent strain of the absorber pattern caused by heat during exposure with EUV light. Examples of materials having a low thermal expansion coefficient within this range that can be used include $SiO_2$—$TiO_2$-based glass and multi-component glass ceramics.

The first main surface on the side on which a transfer pattern of the substrate 1 (which is composed by an absorber film to be subsequently described) is subjected to surface processing so as to obtain a high degree of flatness at least from the viewpoints of pattern transfer accuracy and positional accuracy. In the case of EUV exposure, the degree of flatness in a region measuring 132 mm×132 mm of the main surface on the side on which the transfer pattern of the substrate 1 is formed is preferably not more than 0.1 µm, more preferably not more than 0.05 µm and particularly preferably not more than 0.03 µm. In addition, the second main surface on the opposite side from the side on which the absorber film is formed is the side that is electrostatically chucked when placing in an exposure apparatus, and the degree of flatness in a region measuring 132 mm×132 mm is preferably not more than 0.1 µm, more preferably not more than 0.05 µm and particularly preferably not more than 0.03 µm. Furthermore, the degree of flatness on the side of the second main surface of the reflective mask blank 100 in a region measuring 142 mm×142 mm is preferably not more than 1 µm, more preferably not more than 0.5 µm and particularly preferably not more than 0.3 µm.

In addition, the height of surface smoothness of the substrate 1 is also an extremely important parameter. The surface roughness of the first main surface of the substrate 1 on which an absorber pattern for transfer is formed in terms of root mean square (RMS) roughness is preferably not more than 0.1 nm. Furthermore, surface smoothness can be measured with an atomic force microscope.

Moreover, the substrate 1 preferably has high rigidity to prevent deformation caused by film stress of a film formed thereon (such as the multilayer reflective film 2). In particular, the substrate 1 preferably has a high Young's modulus of not less than 65 GPa.

Multilayer Reflective Film

The multilayer reflective film 2 imparts a function that reflects EUV light in a reflective mask, and the multilayer reflective film 2 has the configuration of a multilayer film in which each layer composed mainly of elements having different refractive indices is cyclically laminated.

In general, a multilayer film obtained by alternately laminating roughly 40 to 60 cycles of a thin film of high refractive index material in the form of a light element or compound thereof (high refractive index layer) and a thin film of a low refractive index material in the form of a heavy element or compound thereof (low refractive index layer) is used for the multilayer reflective film 2. The multilayer film may be obtained by laminating a high refractive index layer and low refractive index layer in that order starting from the side of the substrate 1 for a plurality of cycles, with one cycle consisting of a laminated structure of a high refractive index layer/low refractive index layer, or the multilayer film may be obtained by laminating a low refractive index layer and high refractive index layer in that order starting from the side of the substrate 1 for a plurality of cycles, with one cycle consisting of a laminated structure of low refractive index layer/high refractive index layer. Furthermore, the layer on the uppermost side of the multilayer reflective film 2, namely the front side layer of the multilayer reflective film 2 on the opposite side from the substrate 1, is preferably a high refractive index layer. Although the uppermost layer is a low refractive index layer in the aforementioned multilayer film in the case of laminating a high refractive index layer and low refractive index layer in that order on the substrate 1 for a plurality of cycles, with one cycle consisting of a laminated structure of a high refractive index layer/low refractive index layer, in this case, the low refractive index layer ends up being oxidized easily if it composes the uppermost side of the multilayer reflective film 2 and reflectance of the reflective mask decreases. Consequently, the multilayer reflective film 2 is preferably obtained by further forming a high refractive index layer on the low refractive index layer of the uppermost layer. On the other hand, in the aforementioned multilayer film, in the case of laminating a low refractive index layer and high refractive index layer in that order starting from the side of the substrate 1 for a plurality of cycles, with one cycle consisting of a laminated structure of a low refractive index layer/high refractive index layer, since the uppermost layer is a high refractive index layer, the multilayer reflective film 2 can be used as is.

In the present embodiment, a layer containing silicon (Si) is used as a high refractive index layer. The material containing Si may be Si alone or a Si compound containing Si and boron (B), carbon (C), nitrogen (N) and oxygen (O). As a result of using a layer containing Si as a high refractive index layer, a reflective mask for EUV lithography is obtained that demonstrates superior reflectance of EUV light. In addition, in the present embodiment, a glass substrate is preferably used for the substrate 1. Si also demonstrates superior adhesiveness with glass substrates. In addition, a metal selected from molybdenum (Mo), ruthenium (Ru), rhodium (Rh) and platinum (Pt), or an alloy thereof, is used as a low refractive index layer. For example, a Mo/Si cyclically laminated film, obtained by alternately laminating an Mo film and Si film for about 40 to 60 cycles, is preferably used for the multilayer reflective film 2 with respect to EUV light having a wavelength of 13 nm to 14 nm. Furthermore, the uppermost layer of the multilayer reflective film 2 in the form of a high refractive index layer may be formed with silicon (Si), and a silicon oxide layer containing silicon and oxygen may be formed between the uppermost layer (Si) and the Ru-based protective film 3. As a result, resistance of the mask to cleaning can be improved.

The reflectance of this reflective multilayer film 2 alone is normally not less than 65% and the upper limit thereof is normally 73%. Furthermore, the thickness and number of cycles of each layer composing the multilayer reflective film 2 are suitably selected according to exposure wavelength so as to satisfy Bragg's law. Although multiple layers each of a high refractive index layer and low refractive index layer are present in the multilayer reflective film 2, the high refractive index layers and low refractive index layers are not required to have the same thickness. In addition, the film thickness of the Si layer of the uppermost side of the multilayer reflective film 2 can be adjusted within a range that does not cause a decrease in reflectance. Film thickness of the Si on the uppermost side (high refractive index layer) can be 3 nm to 10 nm.

Methods for forming the multilayer reflective film 2 are known in the art. For example, each layer of the multilayer reflective film 2 can be deposited by ion beam sputtering to form the multilayer reflective film 2. In the case of the aforementioned Mo/Si cyclically laminated film, an Si film having a film thickness of about 4 nm is first deposited on the substrate 1 by ion beam sputtering using an Si target, after which an Mo film having a film thickness of about 3 nm is deposited using an Mo target, when defining this deposition procedure as constituting one cycle, followed by forming the multilayer reflective film 2 by laminating for 40 to 60 cycles (with the layer on the uppermost side being an Si layer). In addition, when depositing the multilayer reflective film 2, the multilayer reflective film 2 is preferably formed by ion beam sputtering by supplying krypton (Kr) ion particles from an ion source.

Protective Film

The protective film 3 is formed on the multilayer reflective film 2 in order to protect the multilayer reflective film 2 from dry etching and cleaning in the fabrication process of a reflective mask blank to be subsequently described. In addition, the protective film 3 also serves to protect the multilayer reflective film 2 when repairing opaque defects in an absorber pattern using an electron beam (EB). Here, although FIG. 1 shows the case of the protective film 3 consisting of a single layer, the protective film 3 can also have a laminated structure consisting of not less than three layers. For example, the protective film 3 may use layers comprising substances containing the aforementioned Ru for the lowermost layer and uppermost layer, or the protective film 3 may have a metal or alloy other than Ru interposed between the lowermost layer and the uppermost layer. For example, the protective film 3 can be composed of a material containing ruthenium as the main component thereof. Namely, the material of the protective film 3 may be Ru metal alone or an Ru alloy containing Ru and at least one type of metal selected from, for example, titanium (Ti), niobium (Nb), molybdenum (Mo), zirconium (Zr), yttrium (Y), boron (B), lanthanum (La), cobalt (Co) and rhenium (Re), and nitrogen may also be contained. The case of the protective film 3 being such that a Co—X amorphous metal material, Ni—X amorphous metal material or CoNi—X amorphous metal material is used for the absorber film 4, and the absorber film 4 is patterned by dry etching using a chlorine-based gas (Cl-based gas), is particularly effective. The protective film 3 is preferably formed with a material in which etching selectivity of the absorber film 4 to the protective film 3 during dry etching using a chlorine-based gas (etching rate of the absorber film 4/etching rate of the protective film 3) is not less than 1.5 and preferably not less than 3.

The content ratio of Ru in the Ru alloy is not less than 50% at % to less than 100 at %, preferably not less than 80 at % to less than 100 at %, and more preferably not less than 95 at % to less than 100 at %. In the case the content ratio of Ru in the Ru alloy is not less than 95 at % to less than 100 at % in particular, the protective film 3 can also be provided with an etching stopper function used when etching the absorber film, as well as a protective film function for preventing time-based changes in the multilayer reflective film, while inhibiting diffusion of a constituent element of the multilayer reflective film (silicon) into the protective film 3 and adequately ensuring reflectance of EUV light.

In the case of EUV lithography, since there are few substances that are transparent with respect to exposure light, it is not technically easy to provide a EUV pellicle that prevents adhesion of foreign matter to the surface of the mask pattern. Thus, pellicle-less applications not employing a pellicle have become common. In addition, in the case of EUV lithography, exposure contamination occurs in the manner of deposition of a carbon film or growth of an oxide film on the mask caused by EUV exposure. Consequently, it is necessary to remove foreign matter and contamination on the mask by frequently carrying out cleaning at the stage an EUV reflective mask is used to manufacture a semiconductor device. Consequently, the EUV reflective mask is required to demonstrate considerably more resistance to mask cleaning in comparison with light-transmitting masks for photolithography. The use of a Ru-based protective film containing Ti makes it possible to particularly enhance cleaning resistance to cleaning solutions such as sulfuric acid, sulfuric peroxide mixture (SPM), ammonia, ammonia peroxide mixture (APM), OH radical cleaning solution or ozone water having a concentration of not more than 10 ppm, thereby satisfying the requirement of being resistant to mask cleaning.

Although there are no particular limitations on the thickness of this protective film 3 composed of Ru or an alloy thereof provided it allows the function of the protective film to be demonstrated, from the viewpoint of reflectance of EUV light, the thickness of the protective film 3 is preferably 1.0 nm to 8.0 nm and more preferably 1.5 nm to 6.0 nm.

A deposition method similar to known deposition methods can be used to form the protective film 3 without any particular restrictions. Specific examples thereof include sputtering and ion beam sputtering.

Absorber Film

The absorber film 4 that absorbs EUV light is formed on the protective film 3. The absorber film 4 has a function that absorbs EUV light and is made of a material containing an amorphous metal containing at least one or more elements among cobalt (Co) and nickel (Ni) as a material that can be processed by dry etching. As a result of employing a configuration in which the absorber film 4 contains cobalt (Co) and/or nickel (Ni), the extinction coefficient k can be made to be not less than 0.035 and the thickness of the absorber film can be reduced. In addition, by using an amorphous metal for the absorber film 4, it is possible to increase etching rate, to improve pattern shape, and to improve processing characteristics.

Examples of amorphous metals include those obtained by adding at least one or more elements (X) among tungsten (W), niobium (Nb), tantalum (Ta), titanium (Ti), zirconium (Zr), hafnium (Hf), yttrium (Y) and phosphorous (P) to at least one or more elements among cobalt (Co) and nickel (Ni).

Among these additive elements (X), W, Nb, Ta, Ti, Zr, Hf and Y are non-magnetic metal materials. Consequently, adding these additive elements (X) to Co and/or Ni to obtain Co—X alloys, Ni—X alloys or CoNi—X alloys makes it possible to obtain soft magnetic amorphous metals, thereby making it possible to suppress the magnetism of materials composing the absorber film. As a result, favorable pattern drawing can be carried out without having an effect during electron beam drawing.

In the case the additive element (X) is Zr, Hf or Y, the content of the additive element (X) in a Co—X alloy, Ni—X alloy or CoNi—X alloy is preferably not less than 3 at % and more preferably not less than 10 at %. In the case the content of Zr, Hf and Y is less than 3 at %, it becomes difficult to make the Co—X alloy, Ni—X alloy or CoNi—X alloy amorphous.

In addition, in the case the additive element (X) is W, Nb, Ta or Ti, the content of the additive element (X) in a Co—X alloy, Ni—X alloy or CoNi—X alloy is preferably not less than 10 at % and more preferably not less than 15 at %. In the case the content of W, Nb, Ta and Ti is less than 10 at %, it becomes difficult to make the Co—X alloy, Ni—X alloy or CoNi—X alloy amorphous.

In the case the additive element (X) is P, as a result of making the content of P in NiP to be not less than 9 at % and more preferably not less than 19 at %, a non-magnetic amorphous metal can be obtained and magnetism of the material composing the absorber film can be eliminated. In the case the content of P is less than 9 at %, NiP is magnetic and it becomes difficult to make NiP amorphous.

In addition, the content of the additive element (X) in a Co—X alloy, Ni—X alloy or CoNi—X alloy is adjusted so that the extinction coefficient k at a wavelength of 13.5 nm is not less than 0.035. Thus, the content of the additive element (X) is preferably not more than 97 at %, more preferably not more than 50 at % and even more preferably not more than 24 at %. In particular, the content of Nb, Ti, Zr and Y alone, which have extinction coefficients of less than about 0.035, is preferably not more than 24 at %. In addition, in the case being in the form of a Co—X alloy, Ni—X alloy or CoNi—X alloy, the content of W, Ta, Hf and P, which have extinction coefficients of not less than 0.035, is adjusted so that the extinction coefficient k is not less than 0.035 and can also be adjusted so that the extinction coefficient k is not less than 0.045. Consequently, the content of the additive element (X) can be increased in consideration of processing characteristics.

In particular, Ta can be preferably used as an addition element (X) due to its favorable processing characteristics. The Ta content of the alloy is preferably not more than 90 at % and more preferably not more than 80 at % from the viewpoint of reducing thickness of the absorber film 4. In the case the additive element (X) of a Co—X alloy is Ta, the compositional ratio between Co and Ta (Co:Ta) is preferably 9:1 to 1:9 and more preferably 4:1 to 1:4. When samples were analyzed with an X-ray diffraction (XRD) device and cross-sections were observed with a transmission electron microscope (TEM) when the composition ratio of Co:Ta was made to be 3:1, 1:1 or 1:3, the peaks derived from Co and Ta broadened in all samples thereby demonstrating an amorphous structure. In addition, in the case the additive element (X) of an Ni—X alloy is Ta, the compositional ratio between Ni and Ta (Ni:Ta) is preferably 9:1 to 1:9 and more preferably 4:1 to 1:4. When samples were analyzed with an X-ray diffraction (XRD) device and cross-sections were observed with a transmission electron microscope (TEM) when the composition ratio of Ni:Ta was made to be 3:1, 1:1 or 1:3, the peaks derived from Ni and Ta broadened in all samples thereby demonstrating an amorphous structure. In addition, in the case the additive element (X) of a CoNi—X alloy is Ta, the compositional ratio between CoNi and Ta (CoNi:Ta) is preferably 9:1 to 1:9 and more preferably 4:1 to 1:4.

In addition, the Co—X alloy, Ni—X alloy or CoNi—X alloy may contain another element such as nitrogen (N), oxygen (O), carbon (C) or boron (B) in addition to the aforementioned additive element (X) within a range that does not have a large effect on refractive index or extinction coefficient. The use of a CoTa alloy, NiTa alloy or CoNi—X alloy containing nitrogen (N) is preferable for the absorber film since etching rate can be increased. The content of nitrogen (N) in the CoTa alloy, NiTa alloy or CoNi—X alloy is preferably 5 at % to 55 at %.

The absorber film 4 comprised of an amorphous metal in this manner can be formed by a known method in the manner of magnetron sputtering such as DC sputtering or RF sputtering. In addition, a Co—X metal target, Ni—X metal target or CoNi—X metal target may be used for the target, or co-sputtering can also be employed using a Co target, Ni target or CoNi target and an additive element (X) target.

The absorber film 4 may be an absorber film 4 used for the purpose of EUV light as a binary type of reflective mask blank, or may be an absorber film 4 having a phase shift function in consideration of the phase difference of EUV light that is used as a phase shift type of reflective mask blank.

In the case of using the absorber film 4 for the purpose of absorbing EUV light, film thickness is set so that the reflectance of the EUV light with respect to the absorber film 4 is not more than 2% and preferably not more than 1%. In addition, in order to suppress the shadowing effect, the film thickness of the absorber film is required to be less than 60 nm and preferably not more than 50 nm. For example, as indicated by the dotted line in FIG. 3, in the case of having formed the absorber film 4 with a NiTa alloy film, reflectance at 13.5 nm can be made to be 0.11% by making the film thickness 39.8 nm.

In the case the absorber film 4 has a phase shift function, a portion of the light is reflected at the portion where the absorber film 4 is formed at a level that does not have a detrimental effect on pattern transfer while absorbing and reducing EUV light and forms a desired phase difference with light reflected from the field portion that is reflected from the multilayer reflective film through the protective film 3. The absorber film 4 is formed so that the phase difference between light reflected from the absorber film 4 and light reflected from the multilayer reflective film 2 is from 160° to 200°. Image contrast of projected optical images improves as a result of light having a phase difference inverted by 180° interfering with each other at the pattern edges. Resolution increases accompanying this improvement of image contrast and various tolerances relating to exposure light such as exposure quantity tolerance or focus tolerance increase. Although dependent upon the pattern and exposure conditions, a general indicator of reflectance in order to this phase shift effect is typically an absolute reflectance of not less than 1% and a reflection ratio with respect to the multilayer reflective film (with protective film) of not less than 2%.

The absorber film 4 may be a single layer film or multilayer film comprised of a plurality of not less than two layers. In the case the absorber film 4 is a single layer film, the absorber film 4 is characterized by improved production efficiency since the number of steps during mask blank fabrication can be reduced.

In the case the absorber film 4 is a multilayer film, a two-layer structure can be employed comprised of a lower layer film and an upper layer film starting from the substrate side. The lower layer film can be formed with a Co—X amorphous metal, Ni—X amorphous metal or CoNi—X amorphous metal having a large extinction coefficient for EUV light. The upper layer film can be formed with a material obtained by adding oxygen (O) to a Co—X amorphous metal, Ni—X amorphous metal or CoNi—X amorphous metal. The optical constants and film thickness of the upper layer film are preferably suitably set so as to serve as an antireflective film during master pattern inspections using DUV light, for example. As a result of the upper layer film having the function of an antireflective film, inspection sensitivity during mask pattern inspections using light improves. In this manner, various functions can be added by employing a multilayer film. In the case the absorber film 4 has a phase shift function, the range of adjustment of the optical surface can be widened by employing a multilayer film while also making it easier to obtain a desired reflectance. In the case the absorber film 4 is a multilayer film having not less than two layers, one layer of the multilayer film may be a Co—X amorphous metal, Ni—X amorphous metal or CoNi—X amorphous metal.

In addition, an oxide layer may be formed on the surface of the absorber film 4. As a result of forming an oxide layer of a Co—X amorphous metal, Ni—X amorphous metal or CoNi—X amorphous metal, cleaning resistance of an absorber pattern 4*a* of the resulting reflective mask 200 can be improved. The thickness of the oxide layer is preferably not less than 1.0 nm and more preferably not less than 1.5 nm. In addition, the thickness of the oxide layer is preferably not more than 5 nm and more preferably not more than 3 nm. In the case the thickness of the oxide layer is less than 1.0 nm, effects of the oxide layer cannot be expected to be demonstrated as a result of the oxide layer being excessively thin, while if the thickness of the oxide layer exceeds 5 nm, the oxide layer has a considerable effect on surface reflectance to mask inspection light and control for obtaining a prescribed surface reflectance becomes difficult.

Examples of methods used to form the oxide layer include subjecting the mask blank following deposition of the absorber film to hot water treatment, ozone water treatment, heat treatment in a gas containing oxygen, ultraviolet irradiation treatment in a gas containing oxygen and $O_2$ plasma treatment. In addition, in the case the surface of the absorber film 4 is exposed to the atmosphere following deposition of the absorber film 4, an oxide layer may form on the surface layer due to natural oxidation. In particular, in the case of a CoTa alloy, NiTa alloy or CoNiTa alloy containing Ta that is easily oxidized, an oxide layer having a film thickness of 1 nm to 2 nm is formed.

In addition, a gas selected from one or more types of gases selected from the group consisting of a chlorine-based gas such as $Cl_2$, $SiCl_4$, $CHCl_3$, $CCl_4$ and $BCl_3$, a mixed gas of two or more types of gases selected from these chlorine-based gases, a mixed gas containing a chlorine-based gas and He at a prescribed ratio, a mixed gas containing a chlorine-based gas and Ar at a prescribed ratio, a halogen gas containing at least one gas selected from fluorine gas, chlorine gas, bromine gas and iodine gas, and hydrogen halide gases can be used for the etching gas of the absorber film 4. Gases selected from fluorine-based gases such as $CF_4$, $CHF_3$, $C_2F_6$, $C_3F_6$, $C_4F_6$, $C_4F_8$, $CH_2F_2$, $CH_3F$, $C_3F_8$, $SF_6$ and $F_2$, and mixed gases containing a fluorine-based gas and $O_2$ at a prescribed ratio can be used as other etching gases. Moreover, a mixed gas containing these gases and oxygen gas can also be used as etching gas.

In addition, in the case the absorber film 4 has a two-layer structure, etching gases of the upper layer film and the lower layer film may be different. For example, a gas selected from fluorine-bases gases such as $CF_4$, $CHF_3$, $C_2F_6$, $C_3F_6$, $C_4F_6$, $C_4F_8$, $CH_2F_2$, $CH_3F$, $C_3F_8$, $SF_6$ and $F_2$, and mixed gases containing a fluorine-based gas and $O_2$ at a prescribed ratio can be used for the etching gas of the upper layer film. In addition, a gas selected from chlorine-based gases such as $Cl_2$, $SiCl_4$, $CHCl_3$, $CCl_4$ and $BCl_3$, mixed gases containing two or more types of gases selected from these chlorine-based gases, mixed gases containing a chlorine-based gas and He at a prescribed ratio, and mixed gases containing a chlorine-based gas and Ar at a prescribed ratio can be used for the etching gas of the lower layer film. Here, if oxygen is contained in the etching gas at the final stage of etching, surface roughening occurs in the Ru-based protective film. Consequently, an etching gas not containing oxygen is preferably used in the over-etching stage when the Ru-based protective film 3 is exposed to etching. In addition, in the case the absorber film 4 has an oxide layer formed on the surface thereof, the oxide layer is preferably removed using a first etching gas and the remaining absorber film 4 is removed by dry etching using a second etching gas. A chlorine-based gas containing $BCl_3$ gas can be used for the first etching gas and a chlorine-based gas containing a different Cl-based gas from that of the first etching gas can be used for the second etching gas. As a result, the oxide layer can be easily removed and etching time of the absorber layer 4 can be shortened.

Etching Mask Film

The etching mask film 6 may be formed on the absorber film 4 as shown in FIG. 13. A material having high etching selectivity of the absorber film 4 to the etching mask film 6 is used for the material of the etching mask film 6. Here, "etching selectivity of B to A" refers to the ratio of the etching rates of the layer on which etching is desired to be carried out in the form of B to the layer where etching is not carried out (layer serving as mask) in the form of A. More specifically, etching selectivity is specified with the equation "etching selectivity of B to A=etching rate of B/etching rate of A". In addition, "high selectivity" refers to the value of selectivity as defined above being large relative to a comparison target. Etching selectivity of the absorber film 4 to the etching mask film 6 is preferably not less than 1.5 and more preferably not less than 3.

Examples of materials used as materials having etching selectivity of the absorber film 4 to the etching mask film 6 include chromium and chromium compounds.

In this case, the absorber film 4 can be etched with a fluorine-based gas or chlorine-based gas. Examples of chromium compounds include materials containing Cr and at least one element selected from N, O, C and H. Examples of chromium compounds are CrN, CrON, CrCN, CrCON, CrBN, CrBON, CrBCN, CrBOCN and the like. A material substantially free of oxygen is preferable for increasing etching selectivity with a chlorine-based gas. Examples of chromium compounds substantially free of oxygen include CrN, CrCN, CrBN, CrBCN and the like. The Cr content of the chromium compound is preferably not less than 50 at % to less than 100 at % and more preferably not less than 80 at % to less than 100 at %. In addition, "substantially free of oxygen" refers to the content of oxygen in the chromium compound being not more than 10 at % and preferably not more than 5 at %. Furthermore, the aforementioned materials can contain a metal other than chromium within a range that allows the effects of the present disclosure to be obtained.

In addition, in the case of etching the absorber film 4 with a chlorine-based gas that is substantially free of oxygen, a silicon material or silicon compound can be used.

Examples of silicon compounds include materials containing Si and at least one element selected from N, O, C and H, and materials such as metal silicon containing metal in silicon or a silicon compound (metal silicide) or metal silicon compounds (meal silicide compounds). Specific examples of materials containing silicon include SiO, SiN, SiON, SiC, SiCO, SiCN, SiCON, MoSi, MoSiO, MoSiN, MoSiON and the like. Furthermore, the aforementioned materials can contain a semimetal or metal other than silicon within a range that allows the effects of the present disclosure to be obtained.

The additive element (X) of the absorber film 4 is preferably not less than 20 at % in order to make etching selectivity of the absorber film 4 to the etching mask film 6 to be not less than 1.5 during dry etching using a chlorine-based gas.

The film thickness of the etching mask film 6 is preferably not less than 3 nm from the viewpoint of obtaining the function as an etching mask that enables a transfer pattern to be accurately formed on the absorber film 4. In addition, the film thickness of the etching mask film 6 is preferably not more than 15 nm and more preferably not more than 10 nm from the viewpoint of reducing the film thickness of the resist film.

Etching Stopper Film

In addition, the etching stopper film 7 may be formed between the protective film 3 and the absorber film 4 as shown in FIG. 15. A material having high etching selectivity of the absorber film 4 to the etching stopper film 7 (etching rate of absorber film 4/etching rate of etching stopper film 7) during dry etching using a chlorine-based gas is preferable for the material of the etching stopper film 7. Examples of such materials include chromium and chromium compounds. Examples of chromium compounds include materials containing chromium and at least one element selected from N, O, C and H. Examples of chromium compounds include CrN, CrON, CrCN, CrCON, CrBN, CrBON, CrBCN, CrBOCN and the like. A material that is substantially free of oxygen is preferable in order to increase etching selectivity with a chlorine-based gas. Examples of chromium compounds that are substantially free of oxygen include CrN, CrCN, CrBN, CrBCN and the like. The Cr content of the chromium compound is preferably not less than 50 at % to less than 100 at % and more preferably not less than 80 at % to less than 100 at %. Furthermore, the material of the etching stopper film can contain a metal other than chromium within a range that allows the effects of the present disclosure to be obtained.

In addition, in the case the absorber film 4 is etched with a chlorine-based gas, the etching stopper film 7 can use a silicon material or silicon compound. Examples of silicon compounds include materials containing Si and at least one element selected from N, O, C and H as well as materials such as metal silicon (metal silicides) containing metal in silicon, or metal silicon compounds (metal silicide compounds) containing metal in a silicon compound. Specific examples of materials containing silicon include SiO, SiN, SiON, SiC, SiCO, SiCN, SiCON, MoSi, MoSiO, MoSiN, MoSiON and the like. Furthermore, the aforementioned materials can contain a semimetal or metal other than silicon within a range that allows the effects of the present disclosure to be obtained.

In addition, the etching stopper film 7 is preferably formed with the same material as the aforementioned etching mask film 6. As a result thereof, the aforementioned etching mask film 6 can be removed simultaneously when the etching stopper film 7 has been patterned. In addition, the etching stopper film 7 and the etching mask film 6 may be formed with a chromium compound or silicon compound and the compositional ratio between the etching stopper film 7 and the etching mask film 6 may be made to be mutually different.

The film thickness of the etching stopper film 7 is preferably not less than 2 nm from the viewpoint of inhibiting damage to the protective film 3 and causing a change in optical characteristics when etching the absorber film 4. In addition, the film thickness of the etching stopper film 7 is preferably not more than 7 nm and more preferably not more than 5 nm from the viewpoint reducing the total film thickness of the absorber film 4 and the etching stopper film 7, or in other words, reducing the height of the pattern comprised of the absorber pattern 4a and an etching stopper pattern 7a.

In addition, in the case of simultaneously etching the etching stopper film 7 and the etching mask film 6, the film thickness of the etching stopper film 7 is preferably equal to or less than the film thickness of the etching mask film 6. Moreover, in the case (film thickness of etching stopper film 7)≤(film thickness of etching mask film 6), the relationship of (etching rate of etching stopper film 7)≤(etching rate of etching mask film 6) is preferably satisfied.

Back Side Conductive Film

The back side conductive film 5 for electrostatic chucking is typically formed on the side of the second main surface (back side) of the substrate 1 (opposite side from the side on which the multilayer reflective film 2 is formed). The back side conductive film 5 for electrostatic chucking is normally required to demonstrate an electrical property (sheet resistance) of not more than 100Ω/☐(Ω/square). The back side conductive film 5 can be formed by using a target consisting of a metal such as chromium or tantalum or an alloy thereof by, for example, magnetron sputtering or ion beam sputtering.

A material containing chromium (Cr) of the back side conductive film 5 is preferably a Cr compound containing Cr and at least one element selected from boron, nitrogen, oxygen and carbon. Examples of Cr compounds include CrN, CrON, CrCN, CrCON, CrBN, CrBON, CrBCN, CrBOCN and the like.

Tantalum (Ta), an alloy containing Ta or Ta compound containing any of these and at least one element selected from boron, nitrogen, oxygen and carbon is preferably used for the material containing tantalum (Ta) of the back side conductive film 5. Examples of Ta compounds include TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON, TaSiCON and the like.

Materials containing tantalum (Ta) or chromium (Cr) preferably have little nitrogen (N) present on the surface thereof. More specifically, the nitrogen content of a material containing tantalum (Ta) or chromium (Cr) of the surface layer of the back side conductive film 5 is preferably less than 5 at %, and more preferably the surface layer is substantially free of nitrogen. This is because, in the back side conductive layer of a material containing tantalum (Ta) or chromium (Cr), a lower nitrogen content of the surface layer results in increased wear resistance.

The back side conductive film 5 is preferably made of a material containing tantalum and boron. As a result of the back side conductive film 5 being made of a material containing tantalum and boron, a conductive film 23 can be obtained that has wear resistance and chemical resistance. In the case the back side conductive film 5 contains tantalum (Ta) and boron (B), the B content is preferably 5 at % to 30 at %. The ratio of Ta to B (Ta:B) in the sputtering target used to deposit the back side conductive film 5 is preferably 95:5 to 70:30.

Although there are no particular limitations on the thickness of the back side conductive film 5 provided it satisfies the function of being used for electrostatic chucking, it is normally from 10 nm to 200 nm. In addition, this back side conductive film 5 is also provided with the function of adjusting stress on the side of the second main surface of the mask blank 100, and is adjusted so as to obtain a flat reflective mask blank by achieving balance with the stress from each type of film formed on the side of the first main surface.

In addition, as is described in Japanese Patent No. 5883249 B, there is a recent technology in which, in order to correct an error such as error in the positioning of a reflective mask or other transfer mask, the surface or interior of the substrate surface is modified resulting in correction of error in the transfer mask by locally irradiating the substrate of the transfer mask with femtosecond laser pulses. Examples of laser beams used to generate the aforementioned pulses include sapphire lasers (wavelength: 800 nm), Nd-YAG lasers (532 nm) and the like.

When applying the aforementioned technology to the reflective mask 200, the laser beam is thought to be radiated from the side of the second main surface (back side) of the substrate 1. However, in the case of the aforementioned back side conductive film 5 made of a material containing tantalum (Ta) or chromium (Cr), the problem occurs of difficulty of the laser in passing through this film. In order to solve this problem, the back side conductive film 5 is preferably formed using a material in which transmittance with respect to a wavelength of at least 532 nm is not less than 20%.

Indium tin oxide (ITO), fluorine-doped tin oxide (FTO), aluminum-doped zinc oxide (AZO) or antimony-doped tin oxide (ATO) is preferably used for the material of this back side conductive film (transparent conductive film) 5 having high transmittance. Making the film thickness of the transparent conductive film to be not less than 50 nm enables the electrical property (sheet resistance) required of the back side conductive film 5 for electrostatic chucking to be not more than 100Ω/□. For example, the transmittance of an ITO film having a film thickness of 100 nm for a wavelength of 532 nm is about 79.1% and sheet resistance is 50 Ω/□.

In addition, a metal such as platinum (Pt), gold (Au), aluminum (Al) or copper (Cu) is preferably used as a material of the back side conductive film (transparent conductive film) 5 having high transmittance. In addition, a metal compound containing these metals and at least one of boron, nitrogen, oxygen and carbon can also be used within a range that satisfies the desired transmittance and electrical properties. These metal films make it possible to reduce film thickness in comparison with the aforementioned ITO and the like due to the high electrical conductivity thereof. The film thickness of the metal film is preferably not more than 50 nm and more preferably not more than 20 nm from the viewpoint of transmittance. In addition, if the film is excessively thin, since sheet resistance tends to increase rapidly, and from the viewpoint of stability during deposition, the film thickness of the metal film is preferably not less than 2 nm. The transmittance of a Pt film having a film thickness of 10.1 nm with respect to a wavelength of 532 nm is 20.3% and sheet resistance is 25.3 Ω/□.

Materials in the case of using a Pt film for the back side conductive film 5 were produced and evaluated. Namely, the back side conductive film 5 comprised of a Pt film was respectively deposited at film thicknesses of 5.2 nm, 10.1 nm, 15.2 nm and 20.0 nm on the second main surface (back side) of the $SiO_2$—$TiO_2$-based glass substrate 1 by DC magnetron sputtering using a Pt target in an Ar gas atmosphere to produce four substrates with a conductive film.

Figure 8:
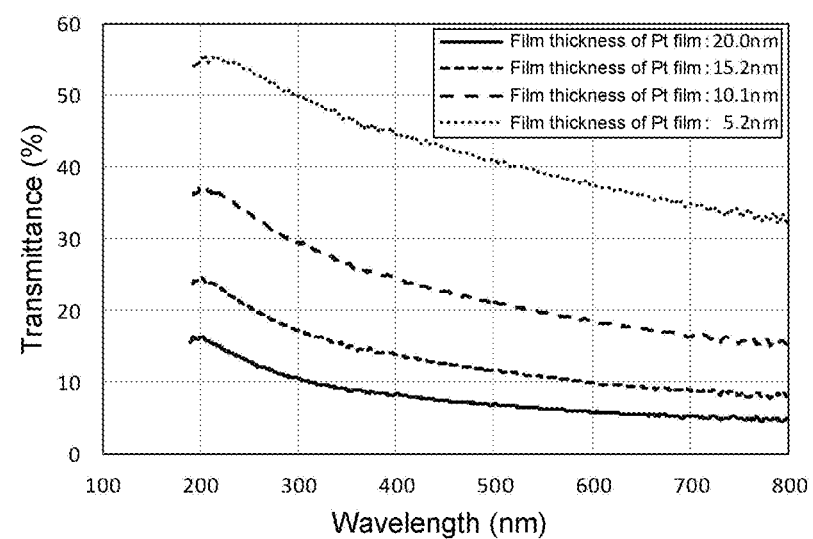
FIG. 8 is a graph indicating the transmittance spectrum for each film thickness of a back side conductive film composed of a Pt film.

When transmittance was measured by radiating light having a wavelength of 532 nm from the second main surfaces (back sides) of the produced four substrates with a conductive film, the transmittance values were 39.8%, 20.3%, 10.9% and 6.5%, respectively, as shown in FIG. 8, and those substrates with a conductive film having film thicknesses of 5.2 nm and 10.1 nm satisfied the requirement of transmittance of not less than 20%. In addition, measurement of sheet resistance according to the four terminal method yielded values of 57.8 Ω/□, 25.3 Ω/□, 15.5Ω/□ and 11.2Ω/□, respectively, with each of these values satisfying the requirement of sheet resistance of not more than 100 Ω/□.

The reflective mask blank 100 was produced using the same method as Example 1 to be subsequently described for the substrate with a conductive film having a film thickness of 10.1 nm followed by the fabrication of the reflective mask 200. When the produced reflective mask 200 was irradiated from the side of the second main surface (back side) of the substrate 1 thereof with a laser beam from a Nd-YAG laser having a wavelength of 532 nm, since the back side conductive film 5 was formed with a Pt film having high transmittance, positioning error of the reflective mask 200 was able to be corrected.

Moreover, the back side conductive film 5 may be a single layer film or have a multilayer structure of not less than 2 layers. In order to improve mechanical durability during electrostatic chucking or improve cleaning resistance, the uppermost layer preferably consists of CrO, TaO or $SiO_2$. In addition, the uppermost layer may consist of an oxide film of the aforementioned metal films, namely PtO, AuO, AlO or CuO. The thickness of the uppermost layer is preferably not less than 1 nm, more preferably not less than 5 nm and even more preferably not less than 10 nm. In the case of the back side conductive film being in the form of a transparent conductive film, the material and film thickness satisfy transmittance of not less than 20%.

In addition, an intermediate layer may be provided on the substrate side of the back side conductive film 5. The intermediate layer can be given a function that improves adhesion between the substrate 1 and the back side conductive film 5 or inhibits the entry of hydrogen from the substrate 1 into the back side conductive film 5. In addition, the intermediate layer can be given a function that inhibits vacuum ultraviolet light and ultraviolet light (wavelength: 130 nm to 400 nm) referred to as out-of-band light from penetrating the substrate 1 and being reflected by the back side conductive film 5 in the case of using EUV light for the exposure light source. Examples of materials of the intermediate layer include Si, $SiO_2$, SiON, SiCO, SiCON, SiBO, SiBON, Cr, CrN, CrON, CrC, CrCN, CrCO, CrCON, Mo, MoSi, MoSiN, MoSiO, MoSiCO, MoSiON, MoSiCON, TaO and TaON. The thickness of the intermediate layer is preferably not less than 1 nm, more preferably not less than 5 nm, and even more preferably not less than 10 nm. In the case the back side conductive film is in the form of a transparent conductive film, the material and film thickness satisfy a transmittance of a laminate of the intermediate layer and transparent conductive substrate of not less than 20%.

As was previously described, although the back side conductive film 5 is required to have desired values for an electrical property (sheet resistance) and transmittance in the case of radiating a laser beam from the back side, when the film thickness of the back side conductive film 5 is reduced in order to satisfy these requirements, different problems may occur. Since the multilayer reflective film 2 normally has high compressive stress, a convex shape forms on the first main surface of the substrate 1 while a concave shape forms in the second main surface (back side). On the other hand, stress is adjusted by annealing (heat treatment) of the multilayer reflective film 2 and deposition of the back side conductive film 5, and is adjusted so as to obtain a reflective mask blank that is flat overall or has only slight concave shape in the second main surface. However, this balance is disrupted if the film thickness of the back side conductive film 5 is excessively thin thereby causing a concave shape in the second main surface to end up becoming excessively large. In this case, scratches form in the periphery of the substrate (and particularly in the corners) during electrostatic chucking and problems such as film separation or particle generation may occur.

In order to solve these problems, the second main surface (back side) of the substrate with a conductive film on which the back side conductive film 5 is formed preferably has a convex shape. A first method for giving the second main surface (back side) of the substrate with a conductive film a convex shape consists of giving the second main surface of the substrate 1 a convex shaped prior to depositing the back side conductive film 5. As a result of preliminarily giving the second main surface of the substrate 1 a convex shape, the shape of the second main surface can be made to be convex even if the back side conductive film 5, comprised of, for example, a Pt film having a film thickness of about 10 nm and having low compressive stress, is deposited and the multilayer reflective film 2 having high compressive stress is deposited.

In addition, a second method for giving the second main surface (back side) of the substrate with a conductive film a convex shape consists of annealing (heat treating) at 150° C. to 300° C. after depositing the multilayer reflective film 2.

Annealing is particularly preferably carried out at a high temperature of not lower than 210° C. Although annealing the multilayer reflective film 2 makes it possible to decrease film stress of the multilayer reflective film 2, there is a tradeoff between annealing temperature and reflectance of the multilayer reflective film 2. When depositing the multilayer reflective film 2, in the case of conventional Ar sputtering in which argon (Ar) ion particles are supplied from an ion source, the desired reflectance is not obtained if annealing is carried out at a high temperature. On the other hand, as a result of carrying out Kr sputtering in which krypton (Kr) ion particles are supplied from an ion source, annealing resistance of the multilayer reflective film 2 can be improved and high reflectance can be maintained if annealed at a high temperature. Thus, as a result of annealing at 150° C. to 300° C. after depositing the multilayer reflective film 2 by Kr sputtering, film stress of the multilayer reflective film 2 can be decreased. In this case, even if the back side conductive film 5, comprised of, for example, a Pt film having a film thickness of about 10 nm and having low film stress, is deposited, the shape of the second main surface can be made to have a convex shape.

Moreover, the aforementioned first method and second method may also be combined. Furthermore, film thickness can be increased in the case of using a transparent conductive film such as an ITO film for the back side conductive film 5. Consequently, the second main surface (back side) of the substrate with a conductive film can be given a convex shape by increasing thickness within a range that satisfies electrical properties.

As a result of giving the second main surface (back side) of the substrate with as conductive film a convex shape in this manner, the formation of scratches in the periphery of the substrate (and particularly, the corners) can be prevented during electrostatic chucking.

In addition, an intermediate layer may be provided on the substrate side of the back side conductive film 5 as previously described in order to solve the problems that occur in the case the film thickness of the back side conductive film (transparent conductive film) 5 is excessively thin. The intermediate layer has a stress adjusting function and is able to allow the obtaining of a desired transmittance (such as that of not less than 20% at a wavelength of 532 nm) when combined with the transparent conductive film.

Figure 9:
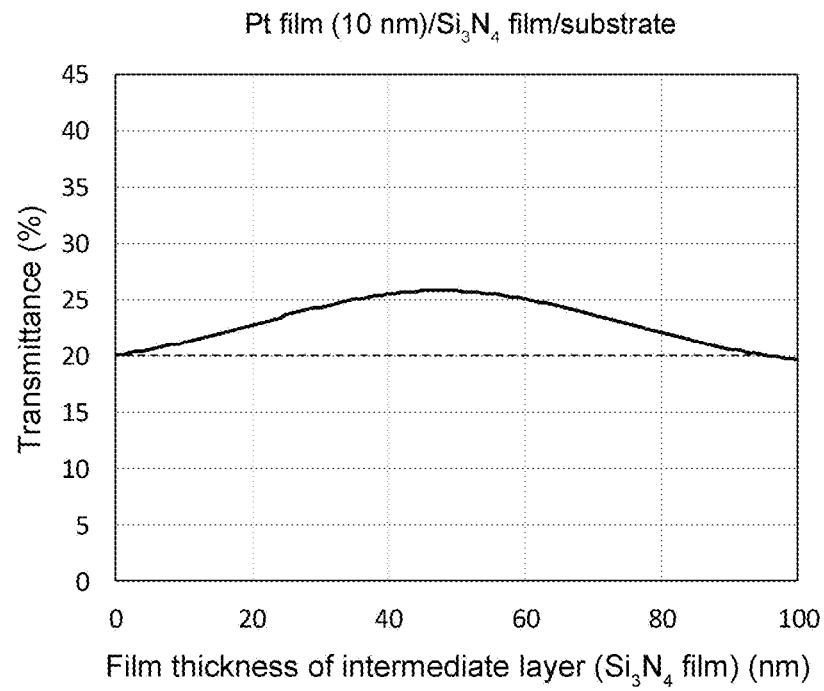
FIG. 9 is a graph indicating changes in transmittance versus changes in film thickness of an intermediate layer in the case of using a Pt film for the back side conductive film and using a $Si_3N_4$ film for the intermediate layer.
Figure 10:
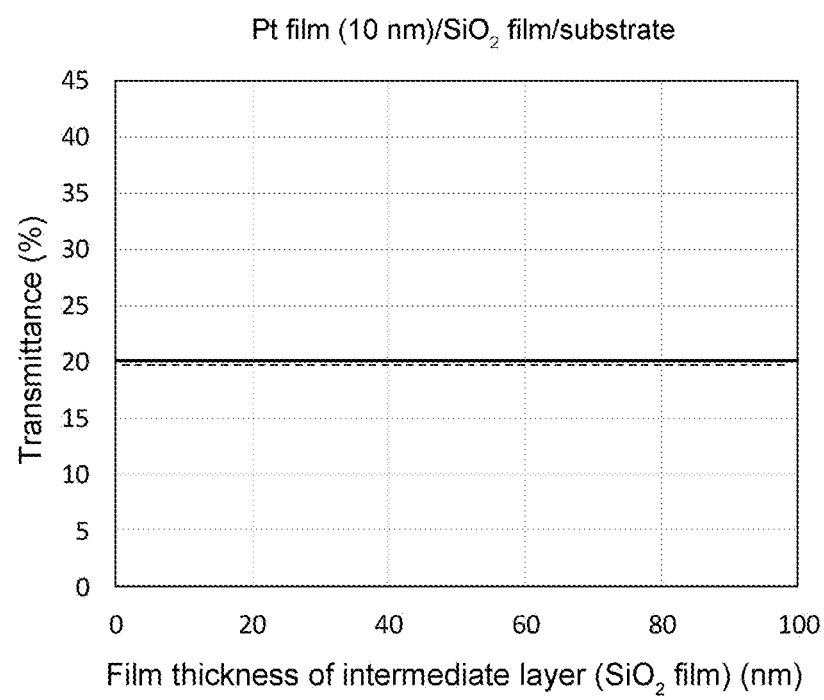
FIG. 10 is a graph indicating changes in transmittance versus changes in film thickness of an intermediate layer in the case of using a Pt film for the back side conductive film and using a $SiO_2$ film for the intermediate layer.

Examples of the material of the intermediate layer include $Si_3N_4$ and $SiO_2$. Since $Si_3N_4$ has high transmittance with respect to a wavelength of 532 nm, there are fewer restrictions on film thickness in comparison with other materials and stress can be adjusted over a film thickness range of 1 nm to 200 nm. FIG. 9 indicates the results of investigating changes in transmittance versus changes in film thickness of the intermediate layer when radiating light of a wavelength of 532 nm from the side of the back side conductive film 5 in the case of using a Pt film having a film thickness of 10 nm for the back side conductive film 5 on the back side of the substrate 1 and using a $Si_3N_4$ film for the intermediate layer. This applies similarly to FIGS. 10 to 12. According thereto, since transmittance is not less than 20% over a range of at least up to 100 nm, the intermediate layer is able to adjust stress over this range. FIG. 10 indicates the results of investigating changes in transmittance versus changes in film thickness of the intermediate layer in the case of using a Pt film having a film thickness of 10 nm for the back side conductive film 5 and using a $SiO_2$ film for the intermediate layer. According thereto, since transmittance is not less than 20% over a range of at least up to 100 nm, the intermediate layer is able to adjust stress over this range.

In the case of using $Si_3N_4$ and $SiO_2$ for the material of the intermediate layer, the film thickness of the back side conductive film 5 comprised of a metal film is preferably 2 nm to 10 nm from the viewpoints of ensuring conductivity and transmittance.

In addition, a Ta-based oxide film and Cr-based oxide film having a low extinction coefficient can be used for the material of the intermediate layer. Examples of Ta-based oxide films include TaO, TaON, TaCON, TaBO, TaBON, TaBCON and the like. Examples of the Cr-based oxide films include CrO, CrON, CrCON, CrBO, CrBON, CrBOCN and the like. Moreover, the material of the intermediate layer may also be an oxide film of the metal film of the aforementioned back side conductive film 5, namely PtO, AuO, AlO or CuO.

Figure 11:
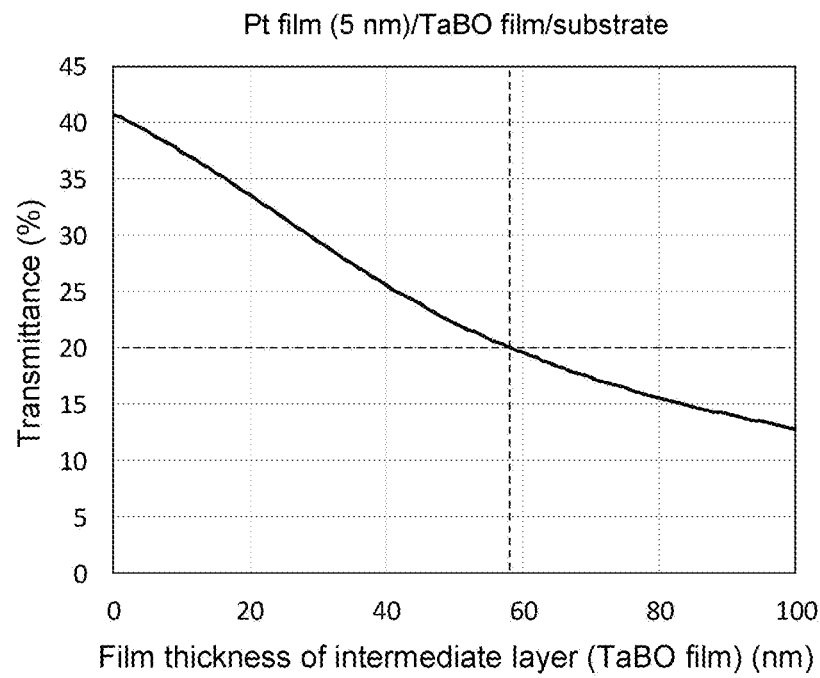
FIG. 11 is a graph indicating changes in transmittance versus changes in film thickness of an intermediate layer in the case of using a Pt film for the back side conductive film and using a TaBO film for the intermediate layer.
Figure 12:
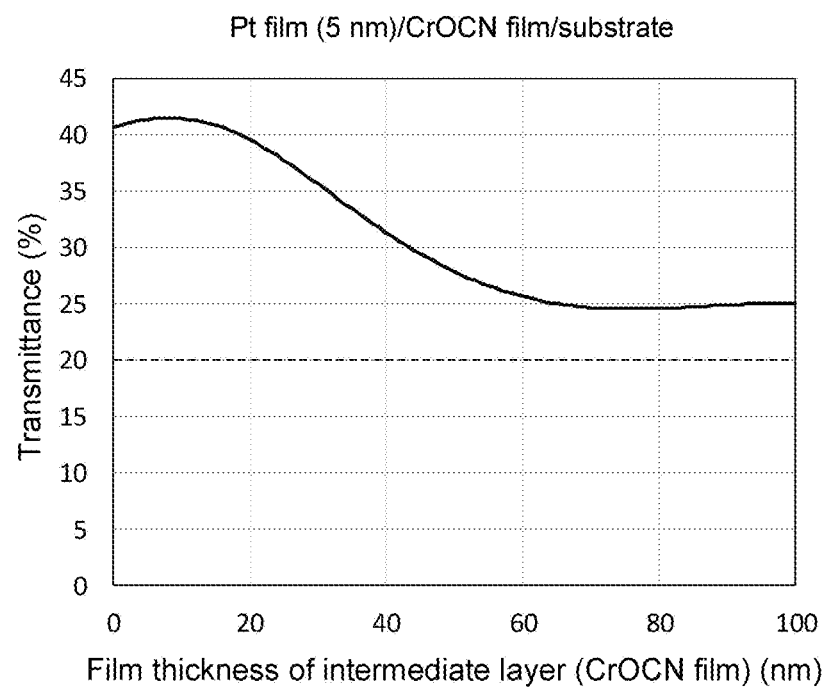
FIG. 12 is a graph indicating changes in transmittance versus changes in film thickness of an intermediate layer in the case of using a Pt film for the back side conductive film and using a CrOCN film for the intermediate layer.

FIG. 11 indicates the results of investigating changes in transmittance versus changes in film thickness of the intermediate layer in the case of using a Pt film having a film thickness of 5 nm for the back side conductive film 5 and using a TaBO film for the intermediate layer. According thereto, since transmittance is not less than 20% over a range of at least up to 58 nm, the intermediate layer is able to adjust stress over this range. FIG. 12 indicates the results of investigating changes in transmittance versus changes in film thickness of the intermediate layer in the case of using a Pt film having a film thickness of 10 nm for the back side conductive film 5 and using a CrOCN film for the intermediate layer. According thereto, since transmittance is not less than 20% over a range of at least up to 100 nm, the intermediate layer is able to adjust stress over this range.

In the case of using a metal oxide film such as a Ta-based oxide film or Cr-based oxide film for the material of the intermediate layer, the film thickness of the back side conductive film 5 comprised of a metal film is preferably 2 nm to 5 nm from the viewpoints of ensuring conductivity and transmittance.

A sample was produced and evaluated in the case of using a Pt film having a film thickness of 10 nm for the back side conductive film 5 and providing an intermediate layer comprised of $Si_3N_4$ between the substrate 1 and the Pt film.

Namely, an intermediate layer comprised of a $Si_3N_4$ film was deposited at a film thickness of 90 nm on the second main surface (back side) of the $SiO_2$—$TiO_2$-based glass substrate 1 by reactive sputtering (RF sputtering) using a Si target in an Ar gas atmosphere. Next, the back side conductive film 5 comprised of a Pt film was deposited at a film thickness of 10 nm by DC magnetron sputtering using a Pt target in an Ar gas atmosphere to produce a substrate with a conductive film.

When transmittance was measured by radiating light having a wavelength of 532 nm from the second main surface (back side) of the produced substrate with a conductive film, transmittance was determined to be 21%. In addition, sheet resistance was 25Ω/☐ when measured according to the four terminal method.

The reflective mask blank 100 was produced using the same method as Example 1 to be subsequently described for a substrate with a conductive film obtained by laminating a $Si_3N_4$ film and Pt film. As a result of measuring the degree of flatness of the back side of the reflective mask blank 100 with a flatness measuring apparatus using optical interference, the back side was confirmed to have a convex shape and a degree of flatness of 95 nm.

Furthermore, when the degree of flatness of the back side of a reflective mask blank was measured in the case of using a Pt film having a film thickness of 10 nm for the back side conductive film but not providing an intermediate layer comprised of $Si_3N_4$, the back side was a concave shape, the degree of flatness was 401 nm, so it was able to be confirmed that the $Si_3N_4$ film had a stress adjusting function.

Subsequently, the reflective mask 200 was produced using the same method as Example 1 to be subsequently described. When a laser beam of a Nd-YAG laser having a wavelength of 532 nm was radiated from the side of the second main surface (back side) of the substrate 1 of the produced reflective mask 200, positioning error of the reflective mask 200 was able to be corrected since the intermediate layer and back side conductive film 5 were formed with a $Si_3N_4$ film and Pt film having high transmittance.

Reflective Mask and Production Method Thereof

A reflective mask is produced using the reflective mask blank 100 of the present embodiment. The following provides only a general explanation, while a detailed explanation is subsequently provided in the examples with reference to the drawings.

The reflective mask blank 100 is prepared, a resist film is formed on the absorber film 4 of the first main surface thereof (not required in the case the reflective mask blank 100 is provided in the form of a resist film), and a desired pattern is drawn (exposed) on this resist film followed by development and rinsing to form a prescribed resist pattern.

In the case of the reflective mask blank 100, an absorber pattern is formed by etching the absorber film 4 by using this resist pattern as a mask, and then removing the resist pattern by ashing or with a resist stripping solution. Finally, wet cleaning is carried out using an acidic or alkaline aqueous solution.

Here, a chlorine-based gas such as $Cl_2$, $SiCl_4$, $CHCl_3$, $CCl_4$ or $BCl_3$, a mixed gas containing a chlorine-based gas and He at a prescribed ratio, or a mixed gas containing a chlorine-based gas and Ar at a prescribed ratio is used for the etching gas of the absorber film 4. Since the etching gas is substantially free of oxygen during etching of the absorber film 4, there is no occurrence of surface roughening of the Ru-based protective film. This gas that is substantially free of oxygen corresponds to an oxygen content in the gas of not more than 5 at %.

According to the aforementioned process, a reflective mask is obtained that exhibits little shadowing effects and has a highly accurate and fine pattern exhibiting little side wall roughness.

Method of Manufacturing Semiconductor Device

A desired transfer pattern based on an absorber pattern on the reflective mask 200 can be formed on a semiconductor substrate by carrying out EUV exposure using the reflective mask 200 of the aforementioned present embodiment while suppressing decreases in transfer dimensional accuracy caused by shadowing effects. In addition, since the absorber pattern constitutes a fine and highly accurate pattern with little sidewall roughness, a desired pattern can be formed on a semiconductor substrate with high dimensional accuracy. A semiconductor device having a desired electronic circuit formed thereon can be manufactured with this lithography step in addition to various other steps such as etching of the processed film, formation of an insulating film and conductive film, introduction of dopant or annealing.

In providing a more detailed explanation, the EUV exposure apparatus is composed of components such as a laser plasma light source that generates EUV light, illumination optical system, mask stage system, reduction projection optical system, wafer stage system and vacuum equipment. The light source is provided with components such as a debris entrapment function, a cutoff filter that cuts out light of a long wavelength other than exposure light, and equipment for vacuum differential evacuation. The illumination optical system and reduction projection optical system are composed of reflective mirrors. The reflective mask 200 for EUV exposure is placed on the mask stage by being electrostatically chucked by a conductive film formed on the second main surface thereof.

EUV exposure light is radiated onto the reflective mask via the illumination optical system at an angle inclined from 6° to 8° to the perpendicular plane of the reflective mask. Light reflected from the reflective mask 200 in response to this incident light is guided to the reflective projection optical system in the opposite direction from the incident light, reflected at the same angle as the incident light (specular reflection), and normally at a reduction ratio of ¼, after which the resist on a wafer (semiconductor substrate) placed on the wafer stage is subjected to exposure. During this time, a vacuum is drawn at least at those locations through which EUV light passes. In addition, this exposure primarily employs scan exposure in which exposure is carried out through a slit by synchronizing and scanning the mask stage and wafer stage at a speed corresponding to the reduction ratio of the reduction projection optical system. A resist pattern can then be formed on a semiconductor substrate by developing this exposed resist film. A mask in the form of a thin film exhibiting little shadowing effects that also has a highly accurate absorber pattern having little sidewall roughness is used in the present disclosure. Consequently, a resist pattern formed on the semiconductor substrate is a desired resist pattern having high dimensional accuracy. As a result of carrying out etching and the like by using this resist pattern as a mask, a prescribed wiring pattern, for example, can be formed on a semiconductor substrate. A semiconductor device is manufactured by going through this type of exposure step, processed film processing step, insulating film and conductive film formation step, dopant introduction step or annealing step and the like.

EXAMPLES

The following provides an explanation of examples with reference to the drawings. Furthermore, the same reference symbols are used to indicate similar constituents in the examples, and explanations thereof may be simplified or omitted.

Example 1

The reflective mask blank 100 of Example 1 has the back side conductive film 5, the substrate 1, the multilayer reflective film 2, the protective film 3 and the absorber film 4 as shown in FIG. 1. The absorber film 4 is comprised of an amorphous alloy of NiTa. As shown in FIG. 2(*a*), a resist film 11 is formed on the absorber film 4. FIG. 2 is a cross-sectional schematic diagram of the main portions indicating a process for manufacturing the reflective mask 200 from the reflective mask blank 100.

First, an explanation is provided of the reflective mask blank 100 of Example 1.

A 6025 size (approx. 152 mm×152 mm×6.35 mm) low thermal expansion glass substrate in the form of a $SiO_2$—$TiO_2$-based glass substrate, of which both the first main surface and second main surface have been polished, is prepared for use as the substrate 1. Polishing consisting of a coarse polishing step, precision polishing step, local processing step and touch polishing step was carried out so as to obtain flat and smooth main surfaces.

The back side conductive film 5 comprised of a CrN film was formed on the second main surface (back side) of the $SiO_2$—$TiO_2$-based glass substrate 1 by magnetron sputtering (reactive sputtering) under the conditions indicated below.

Back side conductive film formation conditions: Cr target, mixed gas atmosphere of Ar and $N_2$ (Ar: 90%, $N_2$: 10%), film thickness: 20 nm.

Next, the multilayer reflective film 2 was formed on the main surface of the substrate 1 on the opposite side from the side on which the back side conductive film 5 was formed (first main surface). The multilayer reflective film 2 formed on the substrate 1 was a cyclical multilayer reflective film comprised of Mo and Si in order to obtain a multilayer reflective film suitable for EUV light at a wavelength of 13.5 nm. The multilayer reflective film 2 was formed by using a Mo target and Si target and alternately laminating Mo layers and Si layers on the substrate 1 by ion beam sputtering in an Ar gas atmosphere. First, a Si film was deposited at a thickness of 4.2 nm followed by depositing an Mo film at a thickness of 2.8 nm. When the deposition of these films is taken to be one cycle, the films were similarly deposited for 40 cycles, with a Si film finally deposited at a thickness of 4.0 nm to form the multilayer reflective film 2. Although the films were deposited for 40 cycles here, the number of cycles is not limited thereto, but rather the films may be deposited for, for example, 60 cycles. In the case of depositing for 60 cycles, although the number of steps increases more than in the case of 40 cycles, this enables reflectance to EUV light to be enhanced.

Continuing, the protective film 3 composed of a Ru film was deposited at a thickness of 2.5 nm by ion beam sputtering using a Ru target in an Ar gas atmosphere.

Next, the absorber film 4 composed of a NiTa film was formed by DC magnetron sputtering. The NiTa film was deposited at a film thickness of 39.8 nm by reactive sputtering using a NiTa target in an Ar gas atmosphere.

The element ratio of the NiTa film was 80 at % of Ni and 20 at % of Ta. In addition, when the crystal structure of the NiTa film was measured with an X-ray diffraction (XRD) apparatus, it was determined to have an amorphous structure. In addition, refractive index n of the NiTa film at a wavelength of 13.5 nm was approximately 0.947 and the extinction coefficient k thereof was approximately 0.063.

Figure 3:
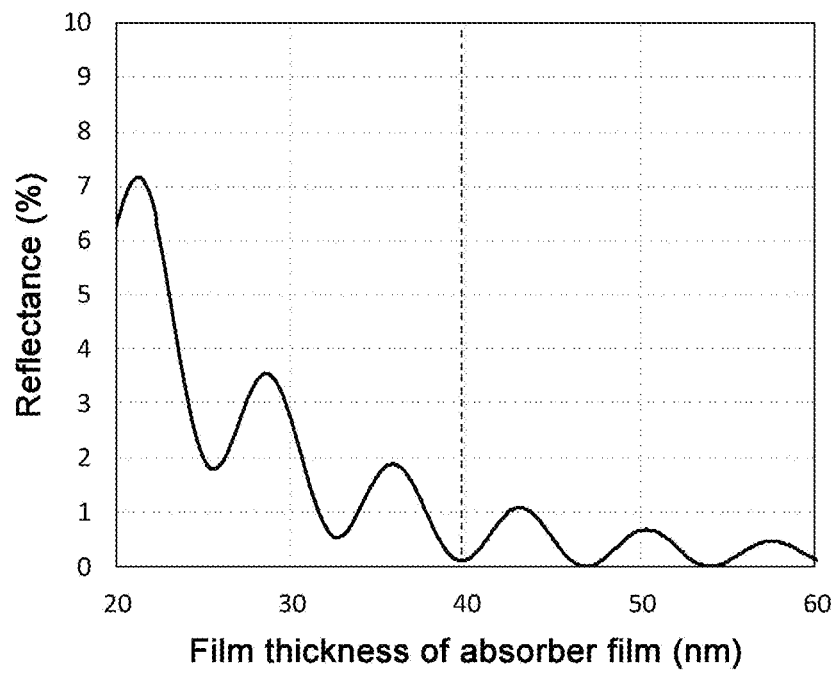
FIG. 3 is a graph indicating the relationship between the thickness of an absorber film of Example 1 and reflectance to light having a wavelength of 13.5 nm.

Reflectance of the absorber film 4 composed of the aforementioned NiTa film at a wavelength of 13.5 nm was 0.11% as a result of employing a film thickness of 39.8 nm (FIG. 3).

Next, the reflective mask 200 of Example 1 was produced using the aforementioned reflective mask blank 100 of Example 1.

Figure 2A:
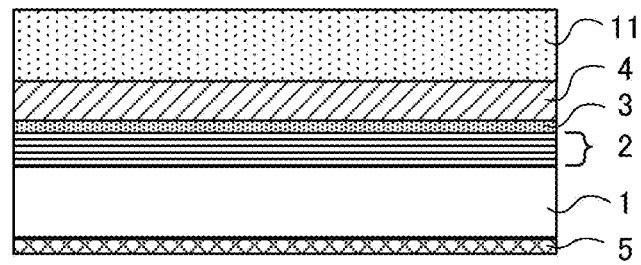
FIG. 2 is a process drawing indicating a process for manufacturing a reflective mask from a reflective mask blank with a cross-sectional schematic diagram of the main portions thereof.
Figure 2B:
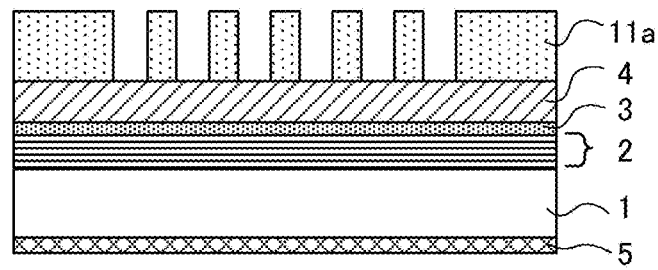
Figure 2C:
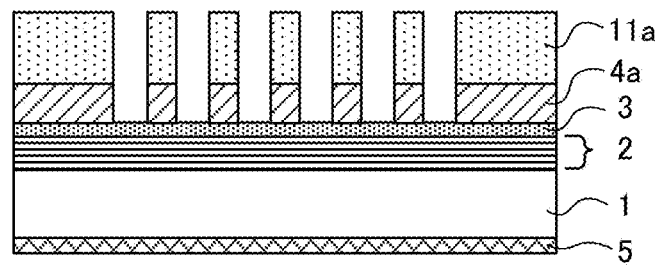
Figure 2D:
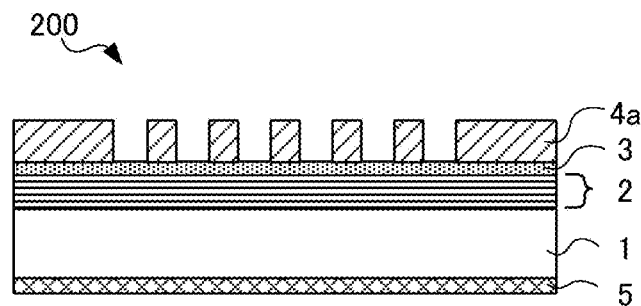

As was previously described, the resist film 11 was formed at a thickness of 150 nm on the absorber film 4 of the reflective mask blank 100 (FIG. 2(a)). A desired pattern was drawn (exposed) on this resist film 11 followed by developing and rinsing to form a prescribed resist pattern 11a (FIG. 2(b)). Next, using the resist pattern 11a as a mask, dry etching of the NiTa film (absorber film 4) was carried out using $Cl_2$ gas to form an absorber film pattern 4a (FIG. 2(c)).

Subsequently, the resist pattern 11a was removed by ashing or with a resist stripping solution. Finally, wet cleaning was performed with pure water (DIW) to produce the reflective mask 200 (FIG. 2(d)). Furthermore, the mask can be inspected for defects as necessary following wet cleaning followed by suitably correcting any mask defects.

In the reflective mask 200 of Example 1, a pattern was able to be confirmed to be able to be drawn as designed even if electron beam drawing was carried out on the resist film 11 of an NiTa film. In addition, since the NiTa film is an amorphous alloy, processability with a chlorine-based gas was favorable and the absorber pattern 4 was able to be formed with high accuracy. In addition, the film thickness of the absorber film 4 was 39.8 nm, thereby enabling the film thickness thereof to be reduced to a thickness less than that of absorber films formed with conventional Ta-based materials, while also making it possible to reduced shadowing effects.

The reflective mask 200 produced in Example 1 was placed in a EUV scanner followed by exposing the wafer, in which the processed film and resist film had been formed on the semiconductor substrate, to EUV light. By then developing this exposed resist film, a resist pattern was formed on the semiconductor substrate having the processed film formed thereon.

A semiconductor device having desired properties was able to be manufactured by transferring this resist pattern to a processed film by etching and then going through various steps such as formation of an insulating film and conductive film, introduction of dopant and annealing.

Example 2

Example 2 is an example of the case of using a NiZr amorphous alloy for the absorber film 4, and is the same as Example 1 with the exception thereof.

Namely, the absorber film 4 comprised of a NiZr film was formed by DC magnetron sputtering. The NiZr film was deposited at a film thickness of 53.9 nm by reactive sputtering in an Ar gas atmosphere using a NiZr target.

The element ratio of the NiZr film was 80 at % Ni and 20 at % Zr. In addition, measurement of the crystal structure of the NiZr film by X-ray diffraction (XRD) demonstrated an amorphous structure. In addition, the refractive index n of the NiZr film at a wavelength of 13.5 nm was about 0.952 and the extinction coefficient k was about 0.049.

Figure 4:
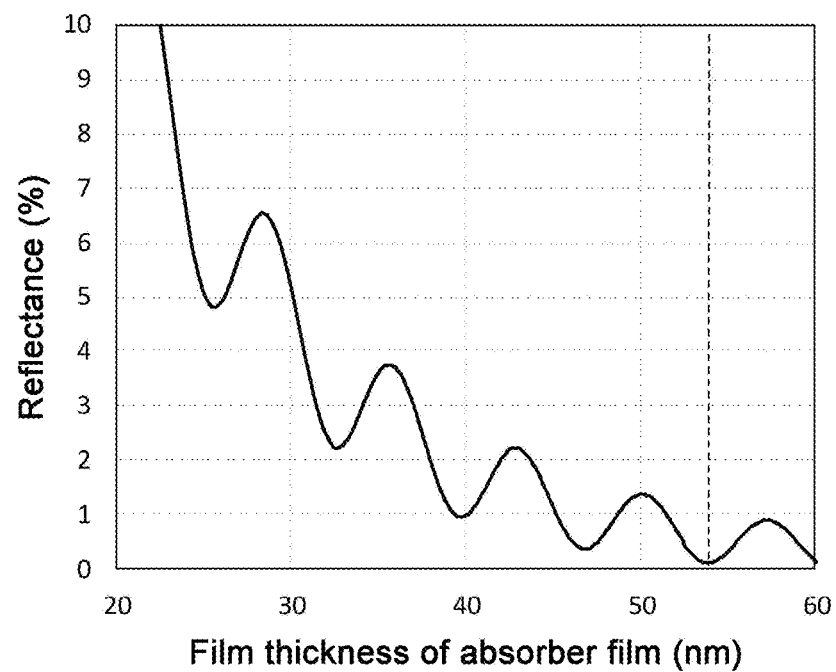
FIG. 4 is a graph indicating the relationship between the thickness of an absorber film of Example 2 and reflectance to light having a wavelength of 13.5 nm.

Reflectance of the absorber film 4 comprised of the aforementioned NiZr film at a wavelength of 13.5 nm was 0.12% since the film thickness was made to be 53.9 nm (FIG. 4).

In addition, fabrication of the reflective mask 200 and semiconductor device of Example 2 in the same manner as Example 1 allowed the obtaining of favorable effects similar to those of Example 1.

Example 3

Example 3 is an example of the case of using a NiP amorphous alloy for the absorber film 4, and is the same as Example 1 with the exception thereof Namely, the absorber film 4 comprised of a NiP film was formed by DC magnetron sputtering. The NiP film was deposited at a film thickness of 46.4 nm by reactive sputtering in an Ar gas atmosphere using a NiP target.

The element ratio of the NiP film was 79.5 at % Ni and 20.5 at % P. In addition, measurement of the crystal structure of the NiP film by X-ray diffraction (XRD) demonstrated an amorphous structure. In addition, the refractive index n of the NiP film at a wavelength of 13.5 nm was about 0.956 and the extinction coefficient k was about 0.056.

Figure 5:
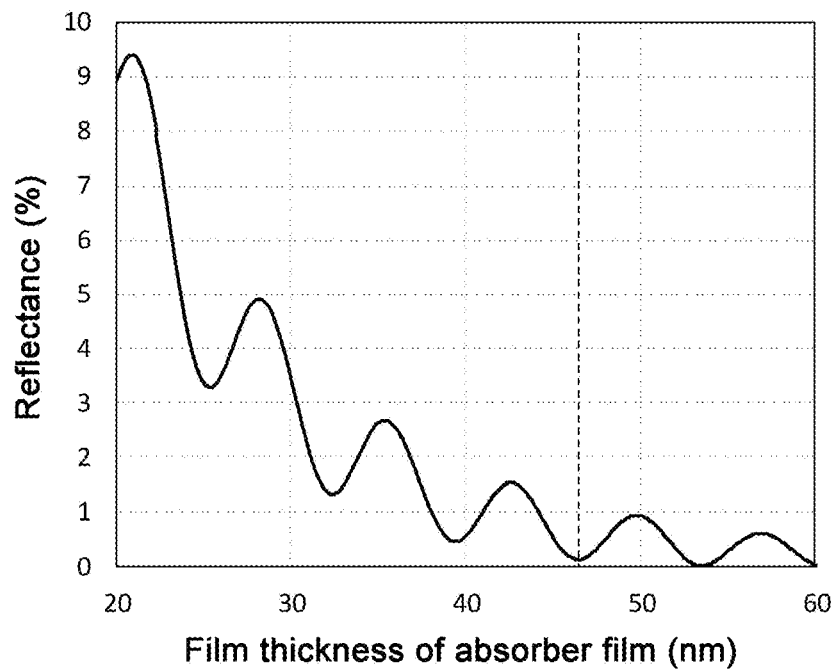
FIG. 5 is a graph indicating the relationship between the thickness of an absorber film of Example 3 and reflectance to light having a wavelength of 13.5 nm.

Reflectance of the absorber film 4 comprised of the aforementioned NiP film at a wavelength of 13.5 nm was 0.13% since the film thickness was made to be 46.4 nm (FIG. 5).

In addition, fabrication of the reflective mask 200 and semiconductor device of Example 3 in the same manner as Example 1 allowed the obtaining of favorable effects similar to those of Example 1.

Example 4

In Example 4, the reflective mask blank 300 provided with the etching mask film 6 was produced as shown in FIG. 13. Example 4 is an example of the case of using a CoTa amorphous alloy for the absorber film 4 and providing the etching mask film 6 comprised of a CrN film on the absorber film 4, and is the same as Example 1 with the exception thereof.

Namely, the absorber film 4 comprised of a CoTa film was formed by DC magnetron sputtering. The CoTa film was deposited at a film thickness of 40.4 nm by reactive sputtering in an Ar gas atmosphere using a CoTa target.

The element ratio of the CoTa film was 80 at % Co and 20 at % Ta. In addition, measurement of the crystal structure of the CoTa film by X-ray diffraction (XRD) demonstrated an amorphous structure. In addition, the refractive index n of the CoTa film at a wavelength of 13.5 nm was about 0.936 and the extinction coefficient k was about 0.059.

Figure 6:
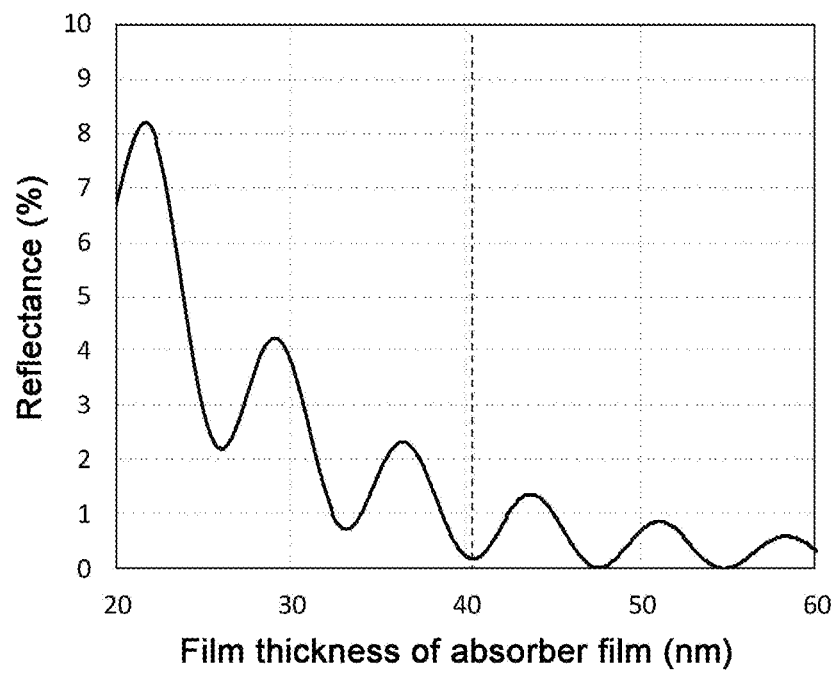
FIG. 6 is a graph indicating the relationship between the thickness of an absorber film of Example 4 and reflectance to light having a wavelength of 13.5 nm.

Reflectance of the absorber film 4 comprised of the aforementioned CoTa film at a wavelength of 13.5 nm was 0.18% since the film thickness was made to be 40.4 nm (FIG. 6).

The etching mask film 6 in the form of a CrN film was formed on the produced substrate with an absorber film by magnetron sputtering (reactive sputtering) under the conditions indicated below to obtain the reflective mask blank 300 of Example 4.

Etching mask film formation conditions: Cr target, mixed gas atmosphere of Ar and $N_2$ (Ar: 90%, N: 10%), film thickness: 10 nm.

Measurement of the elemental composition of the etching mask film 6 by Rutherford backscattering spectrometry analysis yielded 90 at % Cr and 10 at % N.

Next, the reflective mask blank 400 of Example 4 was produced using the aforementioned reflective mask blank 300 of Example 4.

The resist film 11 was formed at a thickness of 100 nm on the etching mask film 6 of the reflective mask blank 300 (FIG. 14(*a*)). A desired pattern was then drawn (exposed) on this resist film 11 followed by developing and rinsing to form a prescribed resist pattern 11*a* (FIG. 14(*b*)). Next, an etching mask pattern 6*a* was formed by using the resist pattern 11*a* as a mask and dry etching the CrN film (etching mask film 6) using a mixed gas of $Cl_2$ gas and $O_2$ ($Cl_2+O_2$ gas) (FIG. 14(*c*)). Continuing, the absorber pattern 4*a* was formed by dry etching the CoTa film (absorber film 4) using $Cl_2$ gas. The resist pattern 11*a* was then removed by ashing or with a resist stripping solution (FIG. 14(*d*)).

Subsequently, the etching mask pattern 6*a* was removed by dry etching using a mixed gas of $Cl_2$ gas and $O_2$ (FIG. 14(*e*)). Finally, wet cleaning was carried out using pure water (DIW) to produce the reflective mask 400 of Example 4.

The absorber film 4 was able to be easily etched as a result of having formed the etching mask film 6 on the absorber film 4. In addition, the thickness of the resist film 11 for forming a transfer pattern was able to be reduced and the reflective mask 400 having a fine pattern was obtained.

In the reflective mask 400 of Example 4, a pattern was able to be confirmed to be able to be drawn as designed even if electron beam drawing was carried out on the resist film 11 on the CoTa film. In addition, since the CoTa film is an amorphous alloy and the etching mask film 6 is provided on the absorber film 4, the absorber pattern 4*a* was able to be formed with high accuracy. In addition, the film thickness of the absorber pattern 4*a* is 40.4 nm, demonstrating that the thickness thereof can be reduced to less than that of an absorber film formed with conventional Ta-based materials and making it possible to reduce shadowing effects.

The reflective mask 400 produced in Example 4 was placed in a EUV scanner followed by exposing the wafer, in which a processed film and resist film had been formed on the semiconductor substrate, to EUV light. By then developing this exposed resist film, a resist pattern was formed on the semiconductor substrate having the processed film formed thereon.

A semiconductor device having desired properties was able to be manufactured by transferring this resist pattern to a processed film by etching and then going through various steps such as formation of an insulating film and conductive film, introduction of dopant and annealing.

Example 5

Example 5 is an example of the case of using a CoNb amorphous alloy for the absorber film 4, and is the same as Example 4 with the exception thereof Namely, the absorber film 4 comprised of a CoNb film was formed by DC magnetron sputtering. The CoNb film was deposited at a film thickness of 47.9 nm by reactive sputtering in an Ar gas atmosphere using a CoNb target.

The element ratio of the CoNb film was 80 at % Co and 20 at % Nb. In addition, measurement of the crystal structure of the CoNb film by X-ray diffraction (XRD) demonstrated an amorphous structure. In addition, the refractive index n of the CoNb film at a wavelength of 13.5 nm was about 0.933 and the extinction coefficient k was about 0.048.

Figure 7:
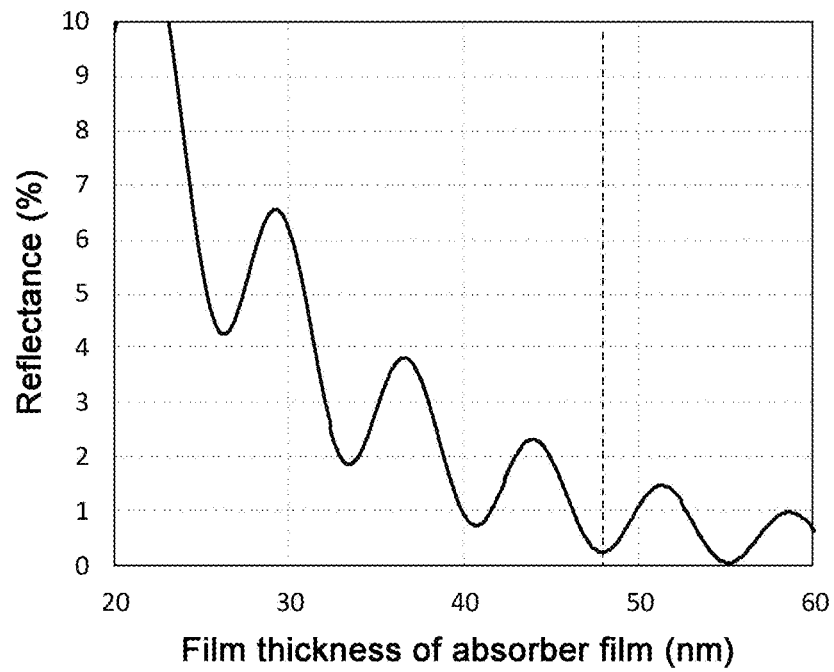
FIG. 7 is a graph indicating the relationship between the thickness of an absorber film of Example 5 and reflectance to light having a wavelength of 13.5 nm.

Reflectance of the absorber film 4 comprised of the aforementioned CoNb film at a wavelength of 13.5 nm was 0.18% since the film thickness was made to be 47.9 nm (FIG. 7).

In addition, fabrication of the reflective mask and semiconductor device of Example 5 in the same manner as Example 4 allowed the obtaining of favorable effects similar to those of Example 4.

Example 6

In Example 6, the reflective mask blank 300 provided with the etching mask film 6 was produced as shown in FIG. 13. Example 6 is an example of the case of using a RuNb amorphous alloy for the protective film 3, using a NiTa amorphous alloy for the absorber film 4, and providing the etching mask film 6 comprised of a CrN film on the absorber film 4.

The protective film 3 was deposited on a substrate with a multilayer reflective film having the back side conductive film 5 and the multilayer reflective film 2 produced in the same manner as Example 1 formed thereon. The protective film 3 was formed in the form of a RuNb film having a film thickness of 2.5 nm by ion beam sputtering using a RuNb target in an Ar gas atmosphere.

Next, the absorber film 4 comprised of a NiTa film was formed by DC magnetron sputtering. The NiTa film was deposited at a film thickness of 40 nm by reactive sputtering in an Ar gas atmosphere using a NiTa target.

The elemental composition of the NiTa film was 50 at % Ni and 50 at % Ta. In addition, measurement of the crystal structure of the NiTa film by X-ray diffraction (XRD) demonstrated an amorphous structure. In addition, the refractive index n of the NiTa film at a wavelength of 13.5 nm was about 0.951 and the extinction coefficient k was about 0.049. In addition, reflectance of the absorber film 4 comprised of the aforementioned NiTa film at a wavelength of 13.5 nm was 1.1%.

The etching mask film 6 in the form of a CrN film was formed on the produced substrate with an absorber film by magnetron sputtering (reactive sputtering). The CrN film was deposited at a film thickness of 10 nm in a mixed gas atmosphere of Ar and $N_2$ using a Cr target. Measurement of the elemental composition of the etching mask film 6 by Rutherford backscattering spectrometry analysis yielded 90 at % Cr and 10 at % N. The reflective mask blank 300 of Example 6 was produced in the manner described above.

Next, the reflective mask blank 400 of Example 6 was produced using the aforementioned reflective mask blank 300 of Example 6.

The resist film 11 was formed at a thickness of 100 nm on the etching mask film 6 of the reflective mask blank 300 (FIG. 14(*a*)). A desired pattern was then drawn (exposed) on this resist film 11 followed by developing and rinsing to form a prescribed resist pattern 11*a* (FIG. 14(*b*)). Next, the etching mask pattern 6*a* was formed by using the resist pattern 11*a* as a mask and dry etching the CrN film (etching mask film 6) using a mixed gas of $Cl_2$ gas and $O_2$ ($Cl_2+O_2$ gas) (FIG. 14(*c*)). Continuing, the absorber pattern 4*a* was formed by dry etching the NiTa film (absorber film 4) using $BCl_3$ gas, and the resist pattern 11*a* was then removed by ashing or with a resist stripping solution (FIG. 14(*d*)).

Subsequently, the etching mask pattern 6*a* was removed by dry etching using a mixed gas of $Cl_2$ gas and $O_2$ (FIG. 14(*e*)). Finally, wet cleaning was carried out using pure water (DIW) to produce the reflective mask 400 of Example 6.

The absorber film 4 was able to be easily etched as a result of having formed the etching mask film 6 on the absorber film 4. In addition, the thickness of the resist film 11 for forming a transfer pattern was able to be reduced and the reflective mask 400 having a fine pattern was obtained.

In the reflective mask 400 of Example 6, a pattern was able to be confirmed to be able to be drawn as designed even if electron beam drawing was carried out on the resist film 11 on the NiTa film. In addition, since the NiTa film is an amorphous alloy and the etching mask film 6 is provided on the absorber film 4, the absorber pattern 4*a* was able to be formed with high accuracy. In addition, the film thickness of the absorber pattern 4*a* was 40 nm, demonstrating that the thickness thereof can be reduced to less than that of an absorber film formed with conventional Ta-based materials and making it possible to reduce shadowing effects.

The reflective mask 400 produced in Example 6 was placed in a EUV scanner followed by exposing the wafer, in which a processed film and resist film had been formed on the semiconductor substrate, to EUV light. By then developing this exposed resist film, a resist pattern was formed on the semiconductor substrate having the processed film formed thereon.

A semiconductor device having desired properties was able to be manufactured by transferring this resist pattern to a processed film by etching and then going through various steps such as formation of an insulating film and conductive film, introduction of dopant and annealing.

Example 7

Example 7 is an example of the case of changing the compositional ratio of the NiTa film of Example 6, and is the same as Example 6 with the exception thereof Namely, the absorber film 4 comprised of a NiTa film was formed by DC magnetron sputtering. The NiTa film was deposited at a film thickness of 40 nm by reactive sputtering in an Ar gas atmosphere using a NiTa target.

The element ratio of the NiTa film was 25 at % Ni and 75 at % Ta. In addition, measurement of the crystal structure of the NiTa film by X-ray diffraction (XRD) demonstrated an amorphous structure. In addition, the refractive index n of the NiTa film at a wavelength of 13.5 nm was about 0.951 and the extinction coefficient k was about 0.040. Reflectance of the absorber film 4 comprised of the aforementioned NiTa film at a wavelength of 13.5 nm was 2.3%.

When the reflective mask 400 of Example 7 was produced in the same manner as Example 6, etching selectivity was greater than that of Example 6 and etching time was able to be shortened. In addition, manufacturing of the semiconductor device of Example 7 in the same manner as Example 6 allowed the obtaining of favorable effects similar to those of Example 6.

Example 8

Example 8 is an example of the case of using a CoTaN amorphous alloy for the absorber film 4, and is the same as Example 6 with the exception thereof Namely, the absorber film 4 comprised of a CoTaN film was formed by DC magnetron sputtering. The CoTaN film was deposited at a film thickness of 40 nm by reactive sputtering in a mixed gas atmosphere of Ar and $N_2$ using a CoTaN target.

The elemental composition of the CoTaN film was 40 at % Co, 40 at % Ta and 20 at % N. In addition, measurement of the crystal structure of the CoTaN film by X-ray diffraction (XRD) demonstrated an amorphous structure. In addition, measurement of the film thickness of the oxide layer formed on the surface of the CoTaN film using X-ray reflectivity (XRR) yielded a film thickness of 1.5 nm. The refractive index n of the CoTaN film at a wavelength of 13.5 nm was about 0.950 and the extinction coefficient k was about 0.047. In addition, reflectance of the absorber film 4 comprised of the aforementioned CoTaN film at a wavelength of 13.5 nm was 1.1%.

In addition, fabrication of the reflective mask and semiconductor device of Example 8 in the same manner as Example 6 allowed the obtaining of favorable effects similar to those of Example 6.

Example 9

Example 9 is an example of the case of changing the etching gas of the absorber film 4, and is the same as Example 8 with the exception thereof.

Namely, the resist film 11 was formed at a thickness of 100 nm on the etching mask film 6 of the reflective mask blank 300 (FIG. 14(*a*)). A desired pattern was then drawn (exposed) on this resist film 11 followed by developing and rinsing to form a prescribed resist pattern 11*a* (FIG. 14(*b*)). Next, the etching mask pattern 6*a* was formed by using the resist pattern 11a as a mask and dry etching the CrN film (etching mask film 6) using a mixed gas of $Cl_2$ gas and $O_2$ ($Cl_2+O_2$ gas) (FIG. 14(c)). Continuing, dry etching was carried out to a depth of 4.9 nm from the surface the CoTaN film (absorber film 4) using $BCl_3$ gas for removing the oxide layer formed on the surface of the CoTaN film. Subsequently, the absorber pattern was formed by dry etching the CoTaN film having a residual film thickness of 35.1 nm using $Cl_2$ gas (FIG. 14(d)).

When the reflective mask and semiconductor device of Example 9 were produced in the same manner as Example 8, favorable results were obtained in the same manner as Example 8. In addition, etching time of the absorber film 4 was able to be shortened in comparison with Example 8.

Example 10

In Example 10, a reflective mask blank 500 provided with the etching stopper film 7 and the etching mask film 6 was produced as shown in FIG. 15. Example 10 is an example of the case of using a CoTa amorphous alloy for the absorber film 4, providing the etching stopper film 7 comprised of a CrN film below the absorber film 4, and providing the etching mask film 6 comprised of a CrN film on the absorber film 4.

Namely, the etching stopper film 7 in the form of a CrN film was formed by magnetron sputtering (reactive sputtering) on a substrate with a protective film having the back side conductive film 5, the multilayer reflective film 2 and the protective film 3 produced in the same manner as Example 6 formed thereon. The CrN film was deposited at a film thickness of 5 nm in a mixed gas atmosphere of Ar and $N_2$ using a Cr target. Measurement of the elemental composition of the etching stopper film 7 by Rutherford backscattering spectrometry analysis yielded 90 at % Cr and 10 at % N.

Next, the absorber film 4 comprised of a CoTa film was formed by DC magnetron sputtering. The CoTa film was deposited at a film thickness of 40 nm by reactive sputtering in an Ar gas atmosphere using a CoTa target.

The elemental composition of the CoTa film was 75 at % Co and 25 at % Ta. In addition, measurement of the crystal structure of the CoTa film by X-ray diffraction (XRD) demonstrated an amorphous structure. In addition, the refractive index n of the CoTa film at a wavelength of 13.5 nm was about 0.952 and the extinction coefficient k was about 0.040. In addition, reflectance of the absorber film 4 comprised of the aforementioned CoTa film at a wavelength of 13.5 nm was 2.4%.

The etching mask film 6 in the form of a CrN film was formed on the produced substrate with an absorber film by magnetron sputtering (reactive sputtering). The CrN film was deposited at a film thickness of 5 nm in a mixed gas atmosphere of Ar and $N_2$ using a Cr target. Measurement of the elemental composition of the etching mask film 6 by Rutherford backscattering spectrometry analysis yielded 90 at % Cr and 10 at % N. The reflective mask blank 500 of Example 10 was produced in the manner described above.

Next, a reflective mask blank 600 was produced using the aforementioned reflective mask blank 500 of Example 10.

Figure 16A:
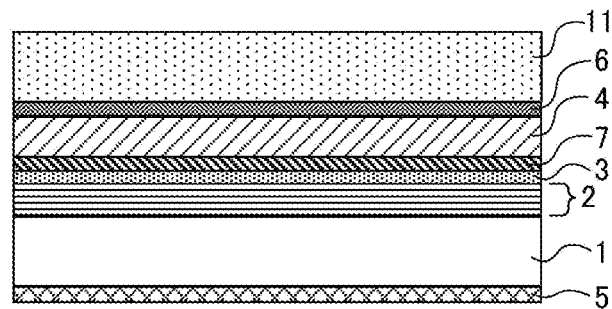
FIG. 16 is a process drawing indicating a process for manufacturing a reflective mask from the reflective mask blank shown in FIG. 15 with a cross-sectional schematic diagram of the main portions thereof.
Figure 16B:
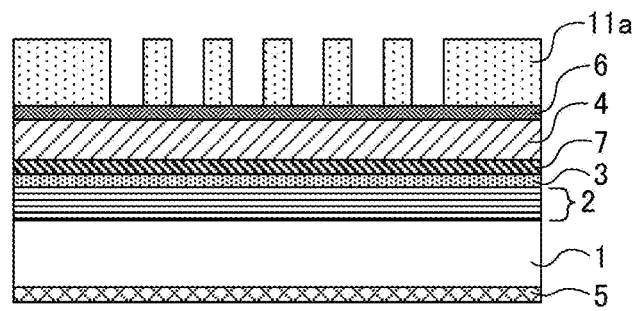
Figure 16C:
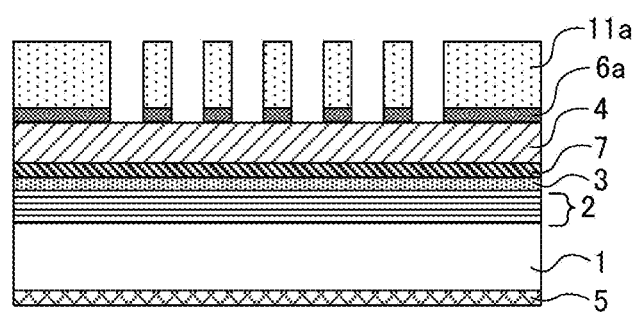
Figure 16D:
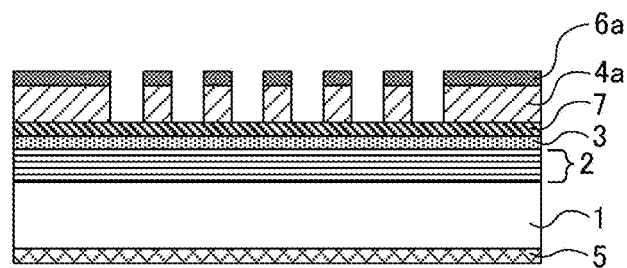

The resist film 11 was formed at a thickness of 80 nm on the etching mask film 6 of the reflective mask blank 500 (FIG. 16(a)). A desired pattern was then drawn (exposed) on this resist film 11 followed by developing and rinsing to form a prescribed resist pattern 11a (FIG. 16(b)). Next, the etching mask pattern 6a was formed by using the resist pattern 11a as a mask and dry etching the CrN film (etching mask film 6) using a mixed gas of $Cl_2$ gas and $O_2$ ($Cl_2+O_2$ gas) (FIG. 16(c)). Continuing, the absorber pattern 4a was formed by dry etching the CoTa film (absorber film 4) using $BCl_3$ gas, and the resist pattern 11a was then removed by ashing or with a resist stripping solution (FIG. 16(d)).

Figure 16E:
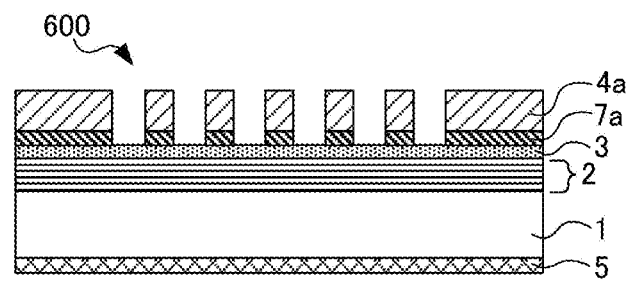

Subsequently, the etching mask pattern 6a was removed simultaneous to patterning the etching stopper film 7 by dry etching using a mixed gas of $Cl_2$ gas and $O_2$ (FIG. 16(e)). Finally, wet cleaning was carried out using pure water (DIW) to produce the reflective mask 600 of Example 10.

In Example 10, the absorber film 4 was able to be easily etched without imparting damage to the protective film 3 as a result of having formed the etching stopper film 7 on the absorber film 4. In addition, the thickness of the resist film 11 for forming a transfer pattern was able to be reduced and the reflective mask 600 having a fine pattern was obtained.

In the reflective mask 600 of Example 10, a pattern was able to be confirmed to be able to be drawn as designed even if electron beam drawing was carried out on the resist film 11 on the CoTa film. In addition, since the CoTa film is an amorphous alloy and the etching mask film 6 and the etching stopper film 7 are provided on the absorber film 4, the absorber pattern 4a was able to be formed with high accuracy without imparting damage to the protective film 3. In addition, the film thickness of the absorber pattern 4a was 40 nm, demonstrating that the thickness thereof can be reduced to less than that of an absorber film formed with conventional Ta-based materials and making it possible to reduce shadowing effects.

Example 11

Example 11 is an example of the case of respectively changing the etching stopper film 7 and the etching mask film 6 to a $SiO_2$ film and changing the etching gas of the absorber film 4, and is the same as Example 10 with the exception thereof Namely, the etching stopper film 7 in the form of a $SiO_2$ film was formed by RF sputtering on a substrate with a protective film having the back side conductive film 5, the multilayer reflective film 2 and the protective film 3 produced in the same manner as Example 6 formed thereon. The $SiO_2$ film was deposited at a film thickness of 5 nm in an Ar gas atmosphere using a $SiO_2$ target. Measurement of the elemental composition of the etching stopper film 7 by Rutherford backscattering spectrometry analysis confirmed the etching stopper film 7 to be $SiO_2$.

Next, the absorber film 4 comprised of a CoTa film was formed by DC magnetron sputtering. The CoTa film was deposited at a film thickness of 40 nm by reactive sputtering in an Ar gas atmosphere using a CoTa target.

The etching mask film 6 in the form of a $SiO_2$ film was formed on the produced substrate with an absorber film by RF sputtering. The $SiO_2$ film was deposited at a film thickness of 5 nm in an Ar gas atmosphere using a $SiO_2$ target. Measurement of the elemental composition of the etching mask film 6 by Rutherford backscattering spectrometry confirmed that the etching mask film 6 was $SiO_2$. The reflective mask blank 500 of Example 11 was produced in this manner.

The resist film 11 was formed at a thickness of 80 nm on the etching mask film 6 of the reflective mask blank 500 of Example 11 (FIG. 16(a)). A desired pattern was then drawn (exposed) on this resist film 11 followed by developing and rinsing to form a prescribed resist pattern 11a (FIG. 16(b)). Next, the etching mask pattern 6a was formed by using the resist pattern 11a as a mask and dry etching the $SiO_2$ film (etching mask film 6) using a fluorine-based gas (specifically, CF$_4$ gas) (FIG. 16(*c*)). Continuing, the absorber pattern 4*a* was formed by dry etching the CoTa film (absorber film 4) using Cl$_2$ gas, and the resist pattern 11*a* was then removed by ashing or with a resist stripping solution (FIG. 16(*d*)).

Subsequently, the etching mask pattern 6*a* was removed simultaneous to patterning the etching stopper film 7 by dry etching using CF$_4$ gas (FIG. 16(*e*)). Finally, wet cleaning was carried out using pure water (DIW) to produce the reflective mask 600 of Example 11.

In addition, production of a semiconductor device in the same manner as Example 10 allowed the obtaining of favorable results similar to Example 10.

Comparative Example 1

In Comparative Example 1, a reflective mask blank and reflective mask were produced using the same structure and method as Example 10 with the exception of using a single layer TaBN film for the absorber film 4, and a semiconductor device was produced in the same manner as Example 1.

The single layer TaBN film was formed instead of a NiTa film on the protective film 3 of the mask blank structure of Example 1. The TaBN film was deposited at a film thickness of 62 nm by reactive sputtering in a mixed gas atmosphere of Ar gas and N$_2$ gas using a TaB mixed sintered target.

The element ratio of the TaBN film was 75 at % Ta, 12 at % B and 13 at % N. The refractive index n of the TaBN film at a wavelength of 13.5 nm was about 0.949 and the extinction coefficient k was about 0.030.

Reflectance of the absorber film comprised of the aforementioned TaBN film at a wavelength of 13.5 nm was 1.4%.

Subsequently, a resist film was formed on the absorber film comprised of the TaBN film using the same method as Example 1 followed by drawing (exposing) a desired pattern, developing and rinsing to form a resist pattern. This resist pattern was then used as a mask to dry-etch the absorber film comprised of the TaBN film using chlorine gas and form an absorber pattern. Removal of the resist pattern and cleaning were carried out in the same manner as Example 1 to produce the reflective mask of Comparative Example 1

The film thickness of the absorber pattern was 62 nm and shadowing effects were unable to be reduced.

BRIEF DESCRIPTION OF REFERENCE SYMBOLS

1 Substrate
2 Multilayer reflective film
3 Protective film
4 Absorber film
4*a* Absorber pattern
5 Back side conductive film
6 Etching mask film
6*a* Etching mask pattern
7 Etching stopper film
7*a* Etching stopper pattern
11 Resist film
11*a* Resist pattern
100, 300, 500 Reflective mask blank
200, 400, 600 Reflective mask

The invention claimed is:

1. A reflective mask blank comprising:
   a substrate;
   a multilayer reflective film formed on the substrate; and
   an absorber film formed on the multilayer reflective film,
   wherein the absorber film is made of a material that has an amorphous structure and that comprises at least one element selected from cobalt (Co) and nickel (Ni).

2. The reflective mask blank according to claim 1, wherein the material of the absorber film further comprises at least one element selected from tungsten (W), niobium (Nb), tantalum (Ta), titanium (Ti), zirconium (Zr), hafnium (Hf), yttrium (Y) and phosphorous (P).

3. The reflective mask blank according to claim 1, wherein the material of the absorber film further comprises tantalum (Ta), and the content of the tantalum (Ta) in the amorphous metal is 10 at % to 90 at %.

4. The reflective mask blank according to claim 1, wherein the reflective mask blank comprises a protective film between the multilayer reflective film and the absorber film.

5. The reflective mask blank according to claim 1, wherein the reflective mask blank comprises an etching mask film on the absorber film, and the etching mask film is made of a material comprising chromium (Cr) or a material comprising silicon (Si).

6. The reflective mask blank according to claim 4, wherein the reflective mask blank comprises an etching stopper film between the protective film and the absorber film, and the etching stopper film is made of a material comprising chromium (Cr) or a material comprising silicon (Si).

7. A reflective mask comprising:
   a substrate;
   a multilayer reflective film formed on the substrate; and
   an absorber pattern formed on the multilayer reflective film,
   wherein the absorber pattern is made of a material that has an amorphous structure and that comprises at least one element selected from cobalt (Co) and nickel (Ni).

8. A method of manufacturing a reflective mask, the method comprising:
   preparing a reflective mask blank comprising:
      a substrate;
      a multilayer reflective film formed on the substrate; and
      an absorber film formed on the multilayer reflective film, wherein the absorber film is made of a material that has an amorphous structure and that comprises at least one element selected from cobalt (Co) and nickel (Ni), and
   forming an absorber pattern by patterning the absorber film of the reflective mask blank by dry etching using at least one chlorine-based gas.

9. The method of manufacturing a reflective mask according to claim 8 in which the dry etching is performed using a first chlorine-based gas and a second chlorine-based gas differing from the first chlorine-based gas.

10. A method of manufacturing a semiconductor device, the method comprising placing the reflective mask according to claim 7 in an exposure apparatus comprising an exposure light source that emits EUV light and transferring a transfer pattern to a resist film formed on a transferred substrate.

11. The reflective mask according to claim 7, wherein the material of the absorber film further comprises at least one element selected from tungsten (W), niobium (Nb), tantalum (Ta), titanium (Ti), zirconium (Zr), hafnium (Hf), yttrium (Y) and phosphorous (P).

12. The reflective mask according to claim 7, wherein the material of the absorber film further comprises tantalum (Ta), and the content of the tantalum (Ta) in the amorphous metal is 10 at % to 90 at %.

13. The reflective mask according to claim 7, wherein the reflective mask comprises a protective film between the multilayer reflective film and the absorber pattern.

14. The reflective mask according to claim 13, wherein the reflective mask comprises an etching stopper pattern between the protective film and the absorber pattern, and the etching stopper pattern is made of a material comprising chromium (Cr) or a material comprising silicon (Si).

15. The method of manufacturing a reflective mask according to claim 8, wherein the material of the absorber film further comprises at least one element selected from tungsten (W), niobium (Nb), tantalum (Ta), titanium (Ti), zirconium (Zr), hafnium (Hf), yttrium (Y) and phosphorous (P).

16. The method of manufacturing a reflective mask according to claim 8, wherein the material of the absorber film further comprises tantalum (Ta), and the content of the tantalum (Ta) in the amorphous metal is 10 at % to 90 at %.

17. The method of manufacturing a reflective mask according to claim 9, wherein the material of the absorber film further comprises at least one element selected from tungsten (W), niobium (Nb), tantalum (Ta), titanium (Ti), zirconium (Zr), hafnium (Hf), yttrium (Y) and phosphorous (P).

18. The method of manufacturing a reflective mask according to claim 9, wherein the material of the absorber film further comprises tantalum (Ta), and the content of the tantalum (Ta) in the amorphous metal is 10 at % to 90 at %.

19. The method of manufacturing a semiconductor device according to claim 10, wherein the material of the absorber film further comprises at least one element selected from tungsten (W), niobium (Nb), tantalum (Ta), titanium (Ti), zirconium (Zr), hafnium (Hf), yttrium (Y) and phosphorous (P).

20. The method of manufacturing a semiconductor device according to claim 10, wherein the material of the absorber film further comprises tantalum (Ta), and the content of the tantalum (Ta) in the amorphous metal is 10 at % to 90 at %.

* * * * *